United States Patent
Blomberg et al.

(10) Patent No.: US 11,183,367 B2
(45) Date of Patent: *Nov. 23, 2021

(54) ATOMIC LAYER ETCHING PROCESSES

(71) Applicant: ASM IP Holding B.V., Almere (NL)

(72) Inventors: Tom E. Blomberg, Vantaa (FI); Varun Sharma, Helsinki (FI); Suvi Haukka, Helsinki (FI); Marko Tuominen, Espoo (FI); Chiyu Zhu, Helsinki (FI)

(73) Assignee: ASM IP HOLDING B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/881,868

(22) Filed: May 22, 2020

(65) Prior Publication Data

US 2020/0312620 A1    Oct. 1, 2020

Related U.S. Application Data

(63) Continuation of application No. 16/390,319, filed on Apr. 22, 2019, now Pat. No. 10,665,425, which is a
(Continued)

(51) Int. Cl.
*H01J 37/32* (2006.01)
*C23F 1/12* (2006.01)
*H01L 21/311* (2006.01)
*C23G 5/00* (2006.01)
*H01L 21/3213* (2006.01)

(52) U.S. Cl.
CPC .......... *H01J 37/32009* (2013.01); *C23F 1/12* (2013.01); *C23G 5/00* (2013.01); *H01L 21/31116* (2013.01); *H01L 21/32135* (2013.01)

(58) Field of Classification Search
None
See application file for complete search history.

(56) References Cited

U.S. PATENT DOCUMENTS

| 7,911,001 B2 | 3/2011 | Lee et al. |
| 8,632,687 B2 | 1/2014 | Auth et al. |

(Continued)

FOREIGN PATENT DOCUMENTS

| JP | H05206088 | 8/1993 |
| JP | H08176851 | 7/1996 |

(Continued)

OTHER PUBLICATIONS

File History of U.S. Appl. No. 16/930,800, filed Jul. 16, 2020.
(Continued)

*Primary Examiner* — Roberts P Culbert
(74) *Attorney, Agent, or Firm* — Knobbe, Martens, Olson & Bear LLP

(57) ABSTRACT

Atomic layer etching (ALE) processes are disclosed. In some embodiments, the methods comprise at least one etch cycle in which the substrate is alternately and sequentially exposed to a first vapor phase non-metal halide reactant and a second vapor phase halide reactant. In some embodiments both the first and second reactants are chloride reactants. In some embodiments the first reactant is fluorinating gas and the second reactant is a chlorinating gas. In some embodiments a thermal ALE cycle is used in which the substrate is not contacted with a plasma reactant.

31 Claims, 7 Drawing Sheets

Related U.S. Application Data continuation of application No. 15/835,272, filed on Dec. 7, 2017, now Pat. No. 10,283,319.

(60) Provisional application No. 62/449,936, filed on Jan. 24, 2017, provisional application No. 62/438,055, filed on Dec. 22, 2016.

(56) References Cited

U.S. PATENT DOCUMENTS

| | | | |
|---|---|---|---|
| 9,396,956 | B1 | 7/2016 | Fukazawa |
| 9,425,041 | B2 | 8/2016 | Berry et al. |
| 9,735,024 | B2 | 8/2017 | Zaitsu |
| 2014/0273492 | A1 | 9/2014 | Anthis |
| 2015/0218695 | A1 | 8/2015 | Odedra |
| 2016/0308112 | A1 | 10/2016 | Tan et al. |
| 2016/0329221 | A1 | 11/2016 | Berry et al. |

FOREIGN PATENT DOCUMENTS

| | | |
|---|---|---|
| KR | 10-1997-0009860 | 3/1997 |
| KR | 10-0707983 | 4/2007 |
| KR | 10-2011-0098355 | 9/2011 |
| KR | 10-1465338 | 11/2014 |
| KR | 10-2016-0143553 | 12/2016 |
| TW | 201525173 | 7/2015 |
| TW | 201608662 | 3/2016 |
| WO | WO 2015/160412 | 10/2015 |
| WO | WO 2016/100873 | 6/2016 |
| WO | WO 2016/160778 | 10/2016 |
| WO | WO 2016/172740 | 10/2016 |
| WO | WO 2017/099718 | 6/2017 |
| WO | WO 2017/205658 | 11/2017 |
| WO | WO 2017/213842 | 12/2017 |
| WO | WO 2018/106955 | 6/2018 |

OTHER PUBLICATIONS

File History of U.S. Appl. No. 16/930,867, filed Jul. 16, 2020.
"Chemicals Used in Chip Fabrication," GAPS Guidelines GAP.17.1.1.B, Global Asset Protection Services LLC, 2015, pp. 1-4.
"Inorganic Analysis," Analyst, 1921,46, pp. 157-161.
"Safetygram #25", Air Products and Chemicals, Inc., 2004 in 8 pages.
"SO3 Gas-Phase Cleaning Process," Final Report, ANON Inc., San Jose, California, 1999, in 19 pages.
"Insights for Electronics Manufacturing", Solid State Technology, Jul. 2016, vol. 59, No. 5, pp. 1-52.
"Xenon Difluoride (XeF2)," Versum Materials, LLC, 2016, in 2 pages.
Barton et al., "The Dissociation of Sulfur Monochloride Vapor," J. Am. Chem. Soc., Feb. 1935, vol. 57 (2), pp. 307-310.
Brandão et al., "Synthesis, Characterization and use of Nb2O5 based Catalysts in Producing Biofuels by Transesterification, Esterification and Pyrolysis," J. Braz. Chem. Soc., 2009, vol. 20, No. 5, pp. 954-966.
Bock et al., "Unstable Intermediates in the Gaseous Phase: The Thermal Decomposition of Acyl Chlorides RCOCl," Angew. Chem. Int. Ed. Engl., 16, (1977) No. 2, pp. 105-107.
Chaiken et al., "Rate of Sublimation of Ammonium Halides," The Journal of Chemical Physics 37, 2311 (1962), in 9 pages.
Chalker, P.R., "Photochemical Atomic Layer Deposition and Etching," Surface & Coatings Technology, 291, (2016), pp. 258-263.
Coman et al., "NbF5—AlF3 Catalysts: Design, Synthesis, and Application in Lactic Acid Synthesis from Cellulose", ACS Catal., 2015, 5 (5), pp. 3013-3026.
Dumont et al., "Competition Between Al2O3 Atomic Layer Etching and AlF3 Atomic Layer Deposition Using Sequential Exposures of Trimethylaluminum and Hydrogen Fluoride." The Journal of Chemical Physics, 146, (2017), p. 052819-1-052819-10.

Dumont et al., "Thermal Atomic Layer Etching of SiO2 by a "Conversion-Etch" Mechanism Using Sequential Reactions of Trimethylaluminum and Hydrogen Fluoride," ACS Appl. Mater. Interfaces, 2017, 9, p. 10296-10307.
File History of U.S. Appl. No. 15/835,272, filed Dec. 7, 2017.
File History of U.S. Appl. No. 16/390,319, filed Apr. 22, 2019.
File History of U.S. Appl. No. 15/835,212, filed Dec. 7, 2017.
File History of U.S. Appl. No. 16/390,385, filed Apr. 22, 2019.
File History of U.S. Appl. No. 16/881,718, filed May 22, 2020.
File History of U.S. Appl. No. 15/835,262, filed Dec. 7, 2017.
File History of U.S. Appl. No. 16/390,540, filed Apr. 22, 2019.
File History of U.S. Appl. No. 16/881,885, filed May 22, 2020.
Jackson et al., "Optimizing AlF3 Atomic Layer Deposition Using Trimethylaluminum and TaF5: Application to High Voltage Li-ion Battery Cathodes," Journal of Vacuum Science & Technology A 34, 2016, p. 031503-1-031503-8.
Johnson et al., Thermal Atomic Layer Etching of Crystalline Aluminum Nitride Using Sequential, Selflimiting Hydrogen Fluoride and Sn(acac)2 Reactions and Enhancement by H2 and Ar.
Johnson et al., "WO3 and W Thermal Atomic Layer Etching Using "Conversion Fluorination" and "Oxidation-Conversion-Fluorination" Mechanisms", ACS Appl. Mater. Interfaces, 2017, 9, p. 34435-34447.
Huardyiting Zhang, et al., "Atomic Layer Etching of 3D Structures in Silicon: Self-limiting and Nonideal Reactions," Journal of Vacuum Science & Technology A, 2017, p. 031306-1-031306-15.
Kanarik et al., "Overview of Atomic Layer Etching in the Semiconductor Industry," Journal of Vacuum Science & Technology A: Vacuum, Surfaces, and Films 33, 2015, p. 020802-1-020802-14.
Kastenmeier et al., "Remote Plasma Etching of Silicon Nitride and Silicon Dioxide Using NF3/O2 Gas Mixtures," Journal of Vacuum Science & Technology A, 1998, pp. 2047-2056.
Kastenmeier et al., "Surface Etching Mechanism of Silicon Nitride in Fluorine and Nitric Oxide Containing Plasmas," Journal of Vacuum Science & Technology A, 2001, pp. 25-30.
Kepten, et al., "Studies of the Possible Reaction of WF6 with SiO2 and Si3N4 at Several Temperatures." J. Electrochem. Soc., vol. 139, No. 8, Aug. 1992, pp. 2331-2337.
Knapas et al., "Etching of Nb2O5 Thin Films by NbCl5", Chemical Vapor Deposition, 2009, vol. 15, pp. 269-273.
Kohli et al., "Methods for Removal of Particle Contaminants," Developments in Surface Contamination and Cleaning, vol. 3, 2011, in 259 pages.
Kuhle, Engelbert, "One Hundred Years of Sulferic Acid Chemistry, 11b. Substitution and Cyclization Reactions of Sulfenyl Halides", Dec. 1971, pp. 617-638.
Lee et al., "Atomic Layer Etching of HfO2 Using Sequential, Self-Limiting Thermal Reactions with Sn(acac)2 and HF", ECS Journal of Solid State Science and Technology, 4 (6), 2015, pp. N5013-N5022.
Lee et al., "Atomic Layer Etching Al2O3 Using Sequential, Self-Limiting Thermal Reactions with Sn(acac)2 and Hydrogen Fluoride", ACS Nano, 9 (2), 2015, pp. 2061-2070.
Lee et al., "Selectivity in Atomic Layer Etching Using Sequential, Self-Limiting Thermal Reactions," ACS Nano 9, 2061, 2015, in 29 pages.
Lee et al., "Thermal Atomic Layer Etching of Titanium Nitride Using Sequential, Self-Limiting Reactions: Oxidation to TiO2 and Fluorination to Volatile TiF4", Chem. Mater., 2017, 29, pp. 8202-8210.
Lenher, Victor, "Some Properties on Selenium Oxychloride", Contribution from the Department of Chemistry, University of Wisconsin, May 26, 1922, pp. 1664-1667.
Luna, Adolfo E. Castro, "Vapor Pressure of WOCl4", J. Chem. Eng. Data, 1983, 28, p. 349.
McDonald et al., "Corrosion of Steel and Nickel Alloys in Neutral and Acidic Solutions of Thionyl Chloride and Sulfuryl Chloride," Journal of the Electrochemical Society, Jun. 1988, pp. 1313-1316.
Michalski et al., "A New Approach towards Organophosphorus Sulfenyl and Selenyl Halides, Phosphorus and Sulfur and the Related Elements", 30:1-2, Jan. 3, 2007, pp. 221-224.
Nieder-Vahrenholz, et al., " Die Oxidfluoride des Niobs und Tantals", Journal of Inorganic and General Chemistry, Zeitschrift für anorganische Chemie, vol. 544, 1, Jan. 1987, pp. 122-126.

(56) References Cited

OTHER PUBLICATIONS

Oehrlein, et al., "Atomic Layer Etching at the Tipping Point: An Overview", ECS Journal of Solid State Science and Technology, 4 (6), Mar. 27, 2015, pp. N5041-N5053.

Painter, Edgar Page, "The Chemistry and Toxicity of Selenium Compounds, with Special Reference to the Selenium Problem," Chern. Rev., Apr. 1941, 28 (2), pp. 179-213.

Pop et al., "New Group 11 Complexes with Metal-Selenium Bonds of Methyldiphenylphosphane Selenide: A Solid State, Slution and Theoretical Investigation," Dalton Trans., 2011, 40, p. 12479-12490.

Rivillon et al., "Chlorination of Hydrogen-Terminated Silicon (111) Surfaces," J. Vac. Sci. Technol. A 23, Jul./Aug. 2005, pp. 1100-1106.

Shinoda et al., "Thermal Cyclic Etching of Silicon Nitride Using Formation and Desorption of Ammonium Fluorosilicate," Applied Physics Express 9, 2016, p. 106201-1-106201-3.

Société chimique de France. Auteur du texte, "Bulletin de la Société chimique de Paris", L. Hachette; Masson, 1871, p. 47.

Sprenger et al., "Electron-enhanced atomic layer deposition of silicon thin films at room temperature", J. Vac. Sci. Technol. A 36(1), Jan./Feb. 2018, p. 01A118-1-01A118-10.

Suresh B.S., et al., "A Study of the Reaction of Silicon Tetrahalides with Phosphorus Pentoxide and of Alkali Metal Fluorosilicates with Phosphorus Pentoxide and Sulphur Trioxide," Journal of Fluorine, 24, 1984, pp. 399-407.

Svistunova, I.V., "Boron Difluoride Acetylacetonate Sulfenyl (Selenyl) Halides," Russian Journal of General Chemistry, 2010, vol. 80, No. 12, pp. 2430-2437.

Vallée, et al., "Selective Deposition Process Combining PEALD and ALE ex: Ta2O5 and TiO2," Powerpoint presentation at the 2017 ALD Conference, in 53 pages.

ATOMIC LAYER ETCHING PROCESSES

CROSS-REFERENCE TO RELATED APPLICATION

This application is a continuation of U.S. application Ser. No. 16/390,319, filed Apr. 22, 2019, which is a continuation of U.S. application Ser. No. 15/835,272, filed Dec. 7, 2017, now U.S. Pat. No. 10,283,319, which claims priority to U.S. Provisional Application No. 62/438,055, filed Dec. 22, 2016 and U.S. Provisional Application No. 62/449,936, filed Jan. 24, 2017.

BACKGROUND

Field of the Invention

The present application relates to etching processes, more particularly to thermal atomic layer etching processes using sequential reactions.

Background

Vapor deposition processes such as atomic layer deposition (ALD) are well-known. ALD processes typically utilize alternating and sequential pulses of vapor-phase reactants to deposit up to a monolayer of material in a controlled and highly-conformal manner. Thin films deposited by ALD are used in a wide variety of applications, such as in the formation of integrated circuits. Controlled removal of materials is also highly desirable. In contrast to ALD, atomic layer etching (ALE) utilizes sequential pulses of vapor phase reactants to remove up to a monolayer of material from a substrate in each reaction cycle. Typical ALE processes utilize a first reactant to form a first species on the substrate surface that is then removed by a second, excited species generated from a plasma.

SUMMARY OF THE INVENTION

Atomic layer etching (ALE) utilizes sequential pulses of vapor phase reactants to remove material from a substrate in each reaction cycle. In some embodiments up to a monolayer of material is removed in each cycle. A sub-monolayer or more of material can be removed from a substrate by ALE processes comprising contacting the substrate surface in a reaction space with at least one vapor-phase reactant. In some embodiments one or more vapor-phase non-metal halide reactants are used. In some embodiments surface contamination may be removed from a substrate surface, such as B or C contamination.

According to one aspect, a film on a substrate is etched in a reaction chamber by chemical atomic layer etching comprising one or more cycles. In some embodiments each cycle of etching comprises exposing the substrate to a first vapor-phase reactant, such as a halide reactant, for example a non-metal halide reactant, and subsequently exposing the substrate to a second vapor-phase reactant. In some embodiments the first vapor-phase reactant is a halide reactant, such as a non-metal halide reactant, and comprises a first halide ligand and the second vapor-phase reactant comprises a second halide ligand. In some embodiments the first vapor phase halide reactant comprises metal. In some embodiments, the substrate is not contacted with a plasma during the etching cycle. The etching cycle may be repeated two or more times in a row.

The first vapor-phase reactant may form reactant species on the substrate surface. The second vapor-phase reactant may react with the reactant species to form volatile species comprising one or more atoms from the substrate surface. The volatile species may be removed from the reaction chamber, such as by purging with an inert gas. The etching cycle may be repeated until a desired level of etching has been obtained.

In some embodiments the substrate is contacted with one or more additional vapor-phase reactants in the etch cycle.

In some embodiments, the second halide ligand is the same as the first halide ligand. In some embodiments, the first halide ligand and the second halide ligand are Cl.

In some embodiments the second halide ligand is different from the first halide ligand.

In some embodiments the first vapor-phase reactant comprises from 2 to 6 halides and the second vapor-phase reactant comprises from two to six halides. The halides in the first reactant and the second reactant are the same in some embodiments. In some embodiments the first and second reactants comprise the same number of halides.

In some embodiments, the second vapor-phase reactant does not comprise metal.

In some embodiments the first vapor-phase halide reactant, for example a non-metal halide reactant or a halide reactant comprising metal, may be inorganic. In some embodiments the first vapor-phase halide reactant does not comprise both C and H. In some embodiments the first vapor phase halide reactant does not comprise carbon.

In some embodiments the second vapor-phase reactant may be inorganic. In some embodiments the second vapor-phase reactant does not comprise both C and H. In some embodiments the second vapor-phase reactant does not comprise carbon.

In some embodiments the first vapor-phase halide reactant comprises only one type of halide, for example, F, Cl, Br, or I, and the second vapor-phase reactant comprises only one type of halide that is different from the halide in the first vapor-phase reactant. Thus, in some embodiments the first vapor-phase halide reactant comprises only a first type of halide ligand, such as F, Cl, Br, or I, and the second vapor-phase reactant comprises only a second type of halide ligand different from first halide ligand in the first vapor-phase reactant.

Although referred to as the first vapor phase reactant and the second vapor phase reactant, they may be supplied in a different order in different embodiments. For example, in some embodiments the first vapor phase reactant is supplied before the second vapor phase reactant. In some embodiments the second vapor phase reactant is supplied before the first vapor phase reactant. The order of supplying the first and second vapor phase reactant maybe changed, for example the order can be reversed in one or more etch cycles.

One or more additional phases in which the substrate is contacted with a vapor-phase reactant or purge gas can be introduced before or after the supplying the first and/or second vapor phase reactants.

In some embodiments the first vapor phase reactant and second vapor phase reactant comprise the same number of halide ligands. In some embodiments the first vapor phase reactant and the second vapor phase reactant comprise a different number of halides. In some embodiments the first vapor phase reactant comprises one, two, three, four, five or six halides, while the second vapor phase reactant separately comprises one, two, three, four, five or six halides.

In some embodiments the first and second vapor phase reactants both comprise the same halides. In some embodiments the first and second vapor phase reactants comprise different halides.

In some embodiments the first vapor-phase halide reactant comprises one, two, three, four, five or six halides, which may all be the same halide, or may differ, and the second vapor-phase reactant comprises a different number of halides from the first reactant. The halides in the second reactant may be the same as or different from the halides in the first reactant.

In some embodiments the first vapor-phase halide reactant comprises from two to six halides (or halogen atoms), for example chlorides or fluorides, while the second vapor-phase reactant comprises two to six halides (or halogen atoms). In some embodiments the first vapor-phase halide reactant comprises from three to five halides (or halogen atoms), for example chlorides or fluorides, while the second vapor-phase reactant comprises three to five halides (or halogen atoms). The halides in the second vapor phase reactant may be the same as or different from the halides in the first vapor phase reactant.

In some embodiments both the first and second vapor-phase halide reactants comprise from four to five halides (or halogen atoms), for example chlorides or fluorides. The halides in the second vapor phase reactant may be the same as or different from the halide in the first vapor phase reactant.

In some embodiments the first vapor-phase halide reactant is a fluorinating or chlorinating agent while the second vapor phase reactant is a chlorinating or fluorinating agent. In some embodiments the first vapor phase halide reactant is a fluorinating agent while the second vapor phase reactant is a chlorinating agent. In some embodiments the first vapor phase reactant is a chlorinating agent while the second vapor phase reactant is a fluorinating agent.

In some embodiments the first vapor-phase halide reactant comprises more than one, such as two or more, three or more, four or more or five or more halides (or halogen atoms), for example chlorides or fluorides, while the second vapor-phase reactant comprises less than five, less than four, less than three or less than two halides (or halogen atoms). The halides in the second vapor phase reactant may be the same as or different from the halides in the first vapor phase reactant.

In some embodiments the first vapor-phase halide reactant comprises from four to five halides (or halogen atoms), for example chlorides or fluorides, while the second vapor-phase reactant comprises less than five, less than four, less than three or less than two halides (or halogen atoms). The halides in the second vapor phase reactant may be the same as or different from the halides in the first vapor phase reactant.

In some embodiments the second vapor-phase halide reactant comprises more than one, such as two or more, three or more, four or more or five or more halides (or halogen atoms), for example chlorides or fluorides, while the first vapor-phase reactant comprises less than five, less than four, less than three or less than two halides (or halogen atoms). The halides in the second vapor phase reactant may be the same as or different from the halides in the first vapor phase reactant.

In some embodiments the second vapor-phase halide reactant comprises from four to five halides (or halogen atoms), for example chlorides or fluorides, while the first vapor-phase reactant comprises less than five, less than four, less than three or less than two halides (or halogen atoms).

The halides in the second vapor phase reactant may be the same as or different from the halide in the first vapor phase reactant.

In some embodiments, the first vapor-phase non-metal halide reactant is a semi-metal halide reactant, or a non-metal oxyhalide reactant, such as an organic oxyhalide reactant. In some embodiments the second vapor-phase reactant comprises a non-metal halide. In some embodiments, the second vapor-phase non-metal halide reactant is a semi-metal halide reactant, or a non-metal oxyhalide reactant, such as an organic oxyhalide reactant.

In some embodiments, a non-metal halide reactant has the formula $NX_a$, where X is chlorine, bromine, fluorine, or iodine; N is hydrogen, nitrogen, phosphorus, sulfur, selenium, silicon, tellurium, antimony, boron, germanium, or carbon; and 'a' is a stoichiometric indicator greater than or equal to 1 and less than 7. In some embodiments 'a' is less than or equal to 6, less than or equal to 5, less than or equal to 4, less than or equal to 3, less than or equal to 2 or 1.

In some embodiments, a non-metal halide reactant comprises $SCl_2$, $SeCl_4$, $TeF_6$, $SeF_4$, $SeF_6$ or $SeCl_2$. In some embodiments, a non-metal halide reactant comprises $S_2Cl_2$ or $Se_2Cl_2$.

In some embodiments, the non-metal halide reactant comprises a semi-metal halide reactant with the formula $SXa$, where X is chlorine, bromine, fluorine, or iodine; S is silicon, tellurium, antimony, boron, or germanium; and 'a' is a stoichiometric indicator from 1 to 7.

In some embodiments, a non-metal halide reactant comprises $SiCl_4$, $SbF_5$, $SbCl_3$, $SbCl_5$ or $BCl_3$.

In some embodiments, a non-metal halide reactant is an oxyhalide reactant. In some embodiments the non-metal oxyhalide reactant comprises $SeO_2Cl_2$, $SO_2Cl_2$, $SeOCl_2$.

In some embodiments, the non-metal halide reactant comprises $NCl_2F$, $NF_2Cl$, $NOF$, $NO_2F$.

In some embodiments, the non-metal halide reactant comprises a carbon based organic halide. For the purposes of the present application, carbon based halides, including $CCl_4$, are considered to be organic or alkylhalides.

In some embodiments, a carbon based organic oxyhalide comprises bis(trichloromethyl) carbonate ($C_3Cl_6O_3$).

In some embodiments, a carbon based halide comprises $CCl_4$ or $CBr_4$. In some embodiments, a semi-metal based halide comprises $GeCl_4$.

In some embodiments, a carbon based halide comprises $CCl_4$ or $CBr_4$. In some embodiments a non-metal halide reactant comprises a carbon based halide having the general formula $CXaY4-a$, and $CnXaY(2n+2-a)$, where in X is any halide and 'a' can be greater than 1, n can be greater than or equal to 1 and Y is a non-metal, and may be a semi-metal.

In some embodiments, the temperature of the substrate during the etching cycle is about 20° C. to 500° C. In some embodiments, the temperature of the substrate during the etching cycle is about 200° C. to 500° C. or about 300° C. to 500° C.

In some embodiments, the etching cycle further comprises removing excess first reactant from the reaction chamber after contacting the substrate with the first reactant and prior to contacting the substrate with the second reactant.

In some embodiments, a film on a substrate is etched in a reaction chamber by chemical atomic layer etching, comprising two or more etch cycles in which the substrate to a first vapor-phase non-metal halide reactant, and wherein the substrate is not contacted with a plasma reactant during the etching cycle. In some embodiments, the etch cycle additionally comprises a second phase comprising exposing the substrate to a second vapor-phase halide reactant. Each etch cycle forms volatile species comprising one or more atoms from the film. In some embodiments each cycle removes up to a monolayer of material form the film to be etched. The cycle may be repeated until the desired level of etching is obtained.

In some embodiments, the second phase follows the first phase. In some embodiments, the second vapor-phase halide reactant does not comprise metal. In some embodiments, the second vapor-phase halide reactant is a carbon based halide.

In some embodiments, the first vapor-phase non-metal halide reactant has the formula NXa, where X is chlorine, bromine, fluorine, or iodine; N is nitrogen, phosphorous, sulfur, selenium, silicon, tellurium, antimony, boron, germanium or carbon; and a is a stoichiometric indicator from 1 to 7. In some embodiments, the first vapor-phase non-metal halide reactant comprises one or more of $SCl_2$, $SeCl_4$, $SeF_4$, $SF_4$, $SeF_6$ or $SeCl_2$. In some embodiments, first vapor-phase non-metal halide further comprises $S_2Cl_2$ or $Se_2Cl_2$.

In some embodiments, the first non-metal halide reactant is a non-metal halide reactant with the formula L-$SX_2$ or L-$SX_3$, where X is a halide and S can be sulfur or phosphorus, and L can be a dialkylether, such as dimethylether, dialkylthioether, or di-methylthioether; an alkylamine, such as dimethylamine; benzene; an alkyl group; pyridine; thiophene; cyclopropane; or n-haloiminosulfur. In some embodiments, the first vapor-phase non-metal halide reactant can be trifluoro(N-methylmethanaminato)sulfur. In some embodiments, the first vapor-phase non-metal halide reactant comprises N-fluoroformyliminosulfur difluoride (SF2=NCOF). In some embodiments, the first vapor-phase non-metal halide reactant is a semi-metal halide reactant with the formula $SX_a$, where X is chlorine, bromine, fluorine, or iodine; S is silicon, tellurium, antimony, boron, or germanium; and a is a stoichiometric indicator from 1 to 6, from 1 to 5, from 1 to 4, from 1 to 3, from 1 to 2, or 1. In some embodiments, the semi-metal halide comprises $SiCl_4$, $SbCl_3$, $SbCl_5$ or $BCl_3$. In some embodiments, the first non-metal halide reactant comprises a semi-metal oxyhalide for example $SeO_2Cl_2$, $SO_2Cl_2$, $SeOCl_2$. In some embodiments, the first non-metal halide reactant comprises a non-metal (oxy) halide for example $NCl_2F$, $NF_2Cl$, $NOF$, $NO_2F$.

In some embodiments, the etching cycle is repeated two or more times in a row.

In some embodiments, an etch cycle additionally comprises a phase in which the substrate is exposed to an oxygen reactant. In some embodiments, the oxygen reactant comprises one or more of $H_2O$, NO, $SO_3$, $O_2$ and $O_3$.

In some embodiments, an etch cycle additionally comprises a phase in which the substrate is exposed to a ligand exchanger. In some embodiments, the ligand exchanger is selected from Hacac TMA, Sn(acac)$_2$. In some embodiments, the ligand exchanger may comprise a vicinal ketone group, for example hexafluoro acetylacetonato (Hhfac), diacetyl, thd. In Some embodiments a ligand exchanger comprises of a compound having the formula M(thd)x, wherein M is metal, such as a transition metal or alkaline earth metal, and x can be greater than 1 and in some cases greater than 2. In some embodiments the ligand exchanger comprises a metal and at least one 'thd' and/or at least one 'acac' group, or both, for example Mg(thd)(acac).

In some embodiments a first vapor phase reactant may comprise a cyclic compound like cyclohexanedienes (chd), or cyclopentadiene. In some embodiments a first vapor phase reactant may comprise an α,β-unsaturated carbonyl compound, for example a ketone like methyl vinyl ketone.

DETAILED DESCRIPTION

Figure 1:
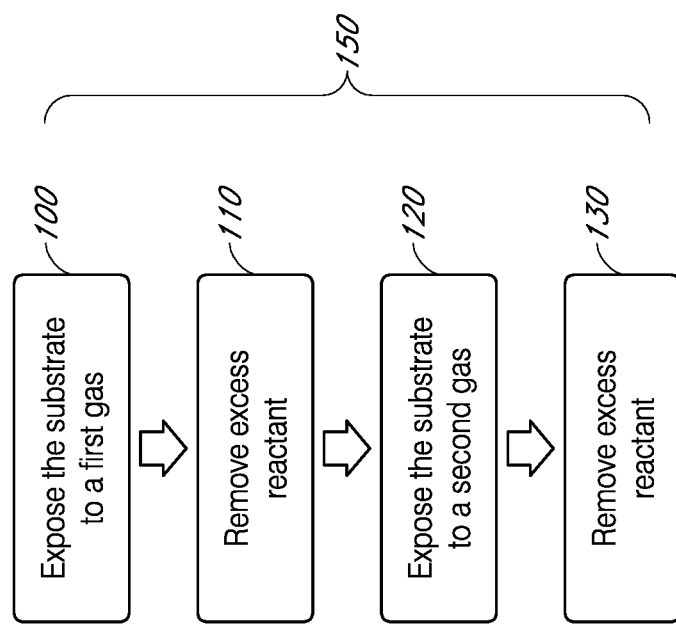
FIG. 1 is a flow chart generally illustrating a method for thermal atomic layer etching in accordance with some embodiments.

A sub-monolayer or more of material can be removed from a substrate by atomic layer etching (ALE) processes comprising contacting the substrate surface in a reaction space with at least one vapor-phase reactant. In some embodiments one or more vapor-phase halide reactants are used. The halide reactants may be metal halides or non-metal halides, where non-metal halides includes semi-metal halides, semi or non-metal oxyhalides, and organic oxyhalides.

In some embodiments surface contamination may be removed from a substrate surface, such as B or C contamination. In this context contamination can be considered any unwanted atoms on the surface or film. In some embodiments contaminants may be, for example metal contaminants, or S or O. In some embodiments contaminants may be removed from a substrate surface or from a film during deposition by providing selective one or more selective etching steps as described herein at one or more points during the deposition process, such as at regular intervals, for example every nth deposition cycle.

In some embodiments, ALE processes comprise alternately contacting the substrate surface in a reaction space with first and second vapor-phase reactants. In some embodiments, one or more of the vapor-phase reactants is a halide reactant. One or more etch cycles may be provided in an ALE process.

In some embodiments, one or more etch cycles comprise alternately exposing the substrate to two different reactants. In some embodiments, the etch cycles comprise exposing the substrate to three different reactants. In some embodiments the etch cycles comprise exposing the substrate to four different reactants. In some embodiments, the etch cycles comprise exposing the substrate to more than four reactants. Each reactant exposure may be separated by a purge of the reaction space, or by pumping down the reaction chamber to remove reaction by products and excess reactant.

In some embodiments, the substrate to be etched is exposed to one or more reactants selected from halides, oxygen compounds, oxygen scavengers, halide exchange drivers, ligand exchangers and metal organic or inorganic reactants. Oxygen compounds may comprise, for example, $H_2O$, $O_2$ or $O_3$. Oxygen scavengers or halide exchange drivers may comprise, for example, $CH_yCl_x$ or $CCl_4$. In some embodiments, an oxygen scavenger or halide exchange driver is a halide as described herein, including a non-metal (or semi-metal) halide. Ligand exchangers or metal or inorganic reactants may comprise, for example, Hacac, TMA or $Sn(acac)_2$. In some embodiments, a ligand exchanger may be a halide as described herein, including a non-metal halide.

In some embodiments, the etch cycles comprise a saturative, self-limiting adsorption step in which the substrate is contacted with at least one halide reactant. For example, the substrate may be contacted with a first vapor-phase reactant followed by a second exposure step in which the substrate is contacted with a second vapor-phase reactant. In the first adsorption step, the first reactant adsorbs in a self-limiting manner to the material to be etched on the substrate surface. The second exposure step then leads to the formation of volatile by-products that contain the adsorbate atoms, the second reactant atoms and some atoms from the surface being etched. In this way, the etching of the desired material on the substrate surface can be carefully controlled.

In some embodiments, the first reactant may comprise a sulfonyl halide, such as an aromatic, saturated, or unsaturated aliphatic sulfonyl halide. In some embodiments, the first reactant may comprise, for example, ethanesulfonyl fluoride ($C_2H_5FO_2S$), methanesulfonyl chloride ($CH_3ClO_2S$), methanesulfonyl fluoride ($CH_3FO_2S$), phenylsulfonyl fluoride ($PhFO_2S$), pyridinesulfonyl fluoride ($C_5H_4FNO_2S$), thiophenesulfonyl fluoride ($C_4H_3FO_2S_2$), cyanomethanesulfonyl chloride ($C_2H_2ClNO_2S$), chloromethanesulfonyl chloride ($ClCH_2SO_2Cl$), or trifluoromethanesulfonyl chloride ($CF_3SO_2Cl$) etc. In some embodiments, the first reactant may comprise a sulfenyl halide compound or selenenyl halide compound. For example, in some embodiments, the first reactant may comprise trichloromethanesulfenyl chloride ($CCl_3SCl$), or chlorocarbonylsulfenyl chloride (ClCOSCl). In some embodiments, the first reactant may comprise a compound having the formula PhSeCl, wherein Ph is a phenyl group. In some embodiments, the first reactant may comprise a compound having the formula RSeX, wherein R is an alkyl ligand and X is a halide.

In some embodiments, the first reactant may comprise sulfur, carbon, and one or more halide atoms, such as thiophosgene ($CSCl_2$).

In some embodiments, the first reactant may comprise sulfur, phosphorous, and one or more halide atoms, such as thiophosphoryl chloride ($PSCl_3$) and thiophosphoryl fluoride ($PSF_3$).

In some embodiments, the first reactant may comprise a ligand, phosphorous, oxygen and one or more halides. In some embodiments the first reactant may have the general formula ligand-$POX_2$. Exemplary ligands include dialkyl amido (e.g. N,N-dimethylphosphoramic dichloride), phenyl (e.g. phenylphosphoryl dichloride) and alkyl (e.g. tert-butylphosphonyl dichloride and methylphosphonyl dichloride).

In some embodiments, the first reactant may not comprise sulfur, oxygen and halide especially with general formulae $SOaXb$, where S can be sulfur or carbon and O is oxygen and X is halide (chlorine, bromine and iodine) and a or b are greater than equal to one. In some embodiments, the first reactant does not comprise interhalogen compound for instance $ClF_3$ and $ClF_5$.

In some embodiments the reactions are not self-limiting or saturating. In some embodiments, at least one of the phases, such as exposure to a first vapor phase reactant, exposure to a second vapor phase reactant or exposure to additional reactants in one or more additional phases, or a reaction itself, such as the etching reaction, is not self-limiting or saturating. In some embodiments, exposure to the first vapor-phase reactant is not self-limiting. In some embodiments exposure to a second vapor phase reactant is not self-limiting. In some embodiments exposure to a first vapor phase reactant is not self-limiting and exposure to a second vapor phase reactant is not self-limiting. However, in some embodiments even if one or more portions of the etch cycle is not self-limiting, controlled etching may be achieved by supplying a controlled dose of one or more of the reactants.

In some embodiments, gas phase reactions are avoided by feeding the reactants alternatively and sequentially into the reaction chamber. Vapor phase reactants are separated from each other in the reaction chamber, for example, by removing excess reactants and/or reaction by-products from the reaction chamber between reactant pulses. The reactants may be removed from the proximity of the substrate surface with the aid of a purge gas and/or vacuum. In some embodiments, excess reactants and/or reactant byproducts are removed from the reaction space by purging, for example, with an inert gas. Because of the separation of reactants and the self-limiting nature of the reactions, less than a monolayer of material is typically removed in each ALE etch cycle. However, in some embodiments, more than one monolayer may be removed in each cycle. In some embodiments, pulses of reactants may partially or completely overlap. For example, in some embodiments, one reactant may flow continuously into the reaction space while one or more additional reactants are provided intermittently, at desired intervals.

In some embodiments, the ALE methods disclosed herein are thermal etching processes, as opposed to plasma etching processes. Thus, plasma reactants are not used in the ALE etch cycles. While referred to as thermal ALE processes to differentiate processes that use plasma reactants, in some embodiments, the ALE reactions may have zero activation energy and therefore may not require any additional thermal energy. Thus, such reactions that do not use plasma reactants may also be referred to as chemical etching processes herein. Thermal ALE methods can be more desirable in some situations than plasma ALE methods because thermal ALE methods can be less damaging to the underlying substrate. Also, thermal ALE methods allow for isotropic etching of non-line of sight (NLOS) features.

The ALE processes disclosed herein utilize particular reactants or combinations of reactants that have been found to allow for controlled etching in the absence of the use of plasma.

In some embodiments, halide reactants are utilized in the ALE processes. In some embodiments, a halide reactant may be a metal halide, such as transition metal halides, for example, halides such as chlorides, fluorides, bromides or iodides of group 5 or 6 transition metals. In some embodiments, a halide reactant is a non-metal halide, such as $S_2Cl_2$, $Se_2Cl_2$, $SCl_2$, $SeCl_4$, $SeF_4$, $SeF_6$ or $SeCl_2$. In some embodiments, a non-metal halide may have the formula NXa, where X is chlorine, bromine, fluorine, or iodine; N is nitrogen, phosphorous, sulfur, selenium, silicon, tellurium, antimony, boron, germanium, or carbon; and a is a stoichiometric indicator. In some embodiments the non-metal halide may be a semi-metal halide, such as $SiCl_4$, $SbCl_3$, $SbF_5$, $SbCl_5$ or $BCl_3$. In some embodiments, a semi-metal halide reactant may have the formula SXa, where X is chlorine, bromine, fluorine, or iodine; S is silicon, tellurium, antimony, boron, or germanium; and a is a stoichiometric indicator. In some embodiments, the halide may be a semi-metal or non-metal oxyhalide such as $SeO_2Cl_2$, $SO_2Cl_2$, $COF_2$, $SO_2F_2$, $SOF_2$, $SeOCl_2$. In some embodiments, the halide may be an oganic (oxy)halide such as $NCl_2F$, $NF_2Cl$, NOF, $NO_2F$. In some embodiments, non-metal halides, such as semi-metal halides may be used in combination with semi-metal oxyhalides and/or non-metal (oxy) halides. In some embodiments non-metal halides, such as semi-metal halides, semi-metal oxyhalides and/or non-metal (oxy) halides can be used in combination with transition metal halides.

In some embodiments, a halide is used as a first reactant. In some embodiments, the halide may be a metal halide, such as a transition metal halide. For example, in some embodiments halides such as chlorides, fluorides, bromides or iodides of group 5 or 6 transition metal halides are used as a first reactant and are contacted to the substrate in a first self-limiting adsorption step. The metal in the first reactant may be, for example, Nb, Ta, Mo Sn, V or W. In some embodiments, the metal halide first reactant is a metal chloride, such as $NbCl_5$, $SnCl_4$, $TaCl_5$, MoClx where x is from about 3 to 5, or WClx where x is from about 4 to 6. In some embodiments the metal halide first reactant is a metal fluoride, such as $NbF_5$, $TaF_5$, $WF_6$, $VF_5$, $SbF_5$, or $MoF_6$. In some embodiments, the metal halide may be a metal bromide or metal iodide, such as $SnBr_4$, $SnI_4$.

In some embodiments, a non-metal halide reactant is used as the first reactant. In some embodiments, a semi-metal halide, a semi/non-metal oxyhalide or an organic (oxy) halide is used as the first reactant.

In some embodiments, a halide reactant as described above is used as the second reactant that reacts with the adsorbed species to form volatile reaction products that can be removed from the reaction space. For example, in some embodiments the second reactant is carbon based halide, such as carbon based fluoride, bromide, iodide or chloride, like $CCl_4$, or $CBr_4$. In some embodiments, the second reactant is a semimetal based halide, such as a Ge halide, for example a semimetal chloride, like $GeCl_4$. In some embodiments, the second reactant is a non-metal halide, a semi-metal halide, a semi/non-metal oxyhalide or an organic (oxy)halide.

In some embodiments a first metal halide reactant is $NbF_5$ and a second halide reactant is $CCl_4$.

In some embodiments, the first reactant and the second reactant comprise the same halide ligand. For example, the first reactant may be a metal chloride, such as $NbCl_5$, $TaCl_5$, $MoCl_3$ or $WCl_2$ and the second reactant may also comprise Cl, such as $CCl_4$.

In some embodiments a first non-metal halide reactant can be $PCl_3$, $NF_3$, $SF_6$, $SeF_x$ where x is greater than 2, and a second halide reactant is $CCl_4$. In some embodiments, the first reactant and the second reactant comprise the same halide ligand.

As mentioned above, in some embodiments the ALE process is a thermal process, and a plasma reactant is not used as a first or second reactant.

In some embodiments, one or more additional reactants may be utilized. In some embodiments, one or more reactants may be used to improve or tune selective etching. The additional reactants may be provided separately, or may be combined with one or more reactants, such as with the second halide reactant. An additional reactant may be an oxygen source. For example, an additional reactant may comprise, for example, water, oxygen or ozone.

In some embodiments, water, oxygen and/or ozone is combined with the second reactant. The ratio of water, oxygen or ozone to the second reactant may be varied to tune the reaction, for example, to tune the selectivity of the etch process or even to stop the etching by forming an etch-stop layer. In some embodiments, the additional reactant may comprise $SO_3$, $SO_2$, $H_2S$, $NH_3$, HCOOH, hydrazine or $N_aO_b$. In some embodiments, the additional reactant may be used in combination with other first or second reactants. In some embodiments, the additional reactant may comprise a nitrogen and oxygen containing compound. For example, in some embodiments, an additional reactant may be a NO gas, supplied additionally from a separate source.

In some embodiments either the first or second reactant may contain a halides which do not contain hydrogen, halides which do not contain either oxygen as well as a hydrogen. In some embodiments either the first or second reactant may contain a halides which do not contain hydrogen, halides which do not contain either oxygen as well as a hydrogen. In some embodiments either the first or second reactant is not $Sn(acac)_2$. In some embodiments either the first or second reactant is not TMA. In some embodiments either the first or second reactant is not HF gas. In some embodiments either the first or second reactant is not HF-Pyridine. In some embodiments the first and second reactants are not HF and $Sn(acac)_2$. In some embodiments the first and second reactants are not HF and $SiCl_4$.

In some embodiments the first vapor-phase halide reactant, for example a non-metal halide reactant or a halide reactant comprising metal, may be inorganic, In some embodiments the first vapor-phase halide reactant does not comprise both C and H. In some embodiments the first vapor phase halide reactant does not comprise carbon. In some embodiments the first vapor phase halide reactant does not comprise hydrogen.

In some embodiments the second vapor-phase reactant may be inorganic. In some embodiments the second vapor-phase reactant does not comprise both C and H. In some embodiments the second vapor-phase reactant does not comprise carbon. In some embodiments the first vapor phase halide reactant does not comprise hydrogen.

In some embodiments the first vapor-phase halide reactant comprises only one type of halide, for example, F, Cl, Br, or I, and the second vapor-phase reactant comprises only one type of halide that is different from the halide in the first vapor-phase reactant. Thus, in some embodiments the first vapor-phase halide reactant comprises only a first type of halide ligand, such as F, Cl, Br, or I, and the second vapor-phase reactant comprises only a second type of halide ligand different from first halide ligand in the first vapor-phase reactant.

Although referred to as the first vapor phase reactant and the second vapor phase reactant, they may be supplied in a different order in different embodiments. For example, in some embodiments the first vapor phase reactant is supplied before the second vapor phase reactant. In some embodiments the second vapor phase reactant is supplied before the first vapor phase reactant. The order of supplying the first and second vapor phase reactant maybe changed, for example reversed in one or more etch cycles.

One or more additional phases in which the substrate is contacted with a vapor-phase reactant or purge gas can be introduced before or after the supplying the first and/or second vapor phase reactants.

In some embodiments the first vapor phase reactant and second vapor phase reactant comprise the same number of halide ligands. In some embodiments the first vapor phase reactant and the second vapor phase reactant comprise a different number of halides. In some embodiments the first vapor phase reactant comprises one, two, three, four, five or six halides, while the second vapor phase reactant separately comprises one, two, three, four, five or six halides.

In some embodiments the first and second vapor phase reactants both comprise the same halides. In some embodiments the first and second vapor phase reactants comprise different halides.

In some embodiments the first vapor-phase halide reactant comprises one, two, three, four, five or six halides, which may all be the same halide, or may differ, and the second vapor-phase reactant comprises a different number of halides from the first reactant. The halides in the second reactant may be the same as or different from the halides in the first reactant.

In some embodiments the first vapor-phase halide reactant comprises from two to six halides (or halogen atoms), for example chlorides or fluorides, while the second vapor-phase reactant comprises two to six halides (or halogen atoms). In some embodiments the first vapor-phase halide reactant comprises from three to five halides (or halogen atoms), for example chlorides or fluorides, while the second vapor-phase reactant comprises three to five halides (or halogen atoms). The halides in the second vapor phase reactant may be the same as or different from the halides in the first vapor phase reactant.

In some embodiments both the first and second vapor-phase halide reactants comprise from four to five halides (or halogen atoms), for example chlorides or fluorides. The halides in the second vapor phase reactant may be the same as or different from the halide in the first vapor phase reactant.

In some embodiments the first vapor-phase halide reactant is a fluorinating or chlorinating agent while the second vapor phase reactant is a chlorinating or fluorinating agent. In some embodiments the first vapor phase halide reactant is a fluorinating agent while the second vapor phase reactant is a chlorinating agent. In some embodiments the first vapor phase reactant is a chlorinating agent while the second vapor phase reactant is a fluorinating agent.

In some embodiments the first vapor-phase halide reactant comprises more than one, such as two or more, three or more, four or more or five or more halides (or halogen atoms), for example chlorides or fluorides, while the second vapor-phase reactant comprises less than five, less than four, less than three or less than two halides (or halogen atoms). The halides in the second vapor phase reactant may be the same as or different from the halides in the first vapor phase reactant.

In some embodiments the first vapor-phase halide reactant comprises from four to five halides (or halogen atoms), for example chlorides or fluorides, while the second vapor-phase reactant comprises less than five, less than four, less than three or less than two halides (or halogen atoms). The halides in the second vapor phase reactant may be the same as or different from the halides in the first vapor phase reactant.

In some embodiments the second vapor-phase halide reactant comprises more than one, such as two or more, three or more, four or more or five or more halides (or halogen atoms), for example chlorides or fluorides, while the first vapor-phase reactant comprises less than five, less than four, less than three or less than two halides (or halogen atoms). The halides in the second vapor phase reactant may be the same as or different from the halides in the first vapor phase reactant.

In some embodiments the second vapor-phase halide reactant comprises from four to five halides (or halogen atoms), for example chlorides or fluorides, while the first vapor-phase reactant comprises less than five, less than four, less than three or less than two halides (or halogen atoms). The halides in the second vapor phase reactant may be the same as or different from the halide in the first vapor phase reactant.

In some embodiments, the first vapor-phase non-metal halide reactant is a semi-metal halide reactant, or a non-metal oxyhalide reactant, such as an organic oxyhalide reactant. In some embodiments the second vapor-phase reactant comprises a non-metal halide. In some embodiments, the second vapor-phase non-metal halide reactant is a semi-metal halide reactant, or a non-metal oxyhalide reactant, such as an organic oxyhalide reactant.

In some embodiments, a non-metal halide reactant has the formula $NX_a$, where X is chlorine, bromine, fluorine, or iodine; N is hydrogen, nitrogen, phosphorus, sulfur, selenium, silicon, tellurium, antimony, boron, germanium, or carbon; and 'a' is a stoichiometric indicator greater than or equal to 1 and less than 7. In some embodiments 'a' is less than or equal to 6, less than or equal to 5, less than or equal to 4, less than or equal to 3, less than or equal to 2 or 1.

In some embodiments, a non-metal halide reactant comprises $SCl_2$, $SeCl_4$, $TeF_6$, $SeF_4$, $SeF_6$ or $SeCl_2$. In some embodiments, a non-metal halide reactant comprises $S_2Cl_2$ or $Se_2Cl_2$.

In some embodiments, the non-metal halide reactant comprises a semi-metal halide reactant with the formula $SX_a$, where X is chlorine, bromine, fluorine, or iodine; S is silicon, tellurium, antimony, boron, or germanium; and 'a' is a stoichiometric indicator from 1 to 7.

In some embodiments, a non-metal halide reactant comprises SiCl4, SbF5, SbCl3, SbCl5 or BCl3.

In some embodiments, a non-metal halide reactant is an oxyhalide reactant. In some embodiments the non-metal oxyhalide reactant comprises SeO2Cl2, SO2Cl2, SeOCl2.

In some embodiments, the non-metal halide reactant comprises NCl2F, NF2Cl, NOF, NO2F.

In some embodiments, the non-metal halide reactant comprises a carbon based organic halide. For the purposes of the present application, carbon based halides, including CCl4, are considered to be organic or alkylhalides.

In some embodiments, a carbon based organic oxyhalide comprises triphosgene or bis(trichloromethyl) carbonate (C3Cl6O3).

In some embodiments, a carbon based halide comprises CCl4 or CBr4. In some embodiments, a semi-metal based halide comprises GeCl4.

In some embodiments, a carbon based halide comprises CCl4 or CBr4. In some embodiments a non-metal halide reactant comprises a carbon based halide having the general formula CXaY4−a, and CnXaY(2n+2−a), where in X is any halide and 'a' can be greater than 1, n can be greater than or equal to 1 and Y is a non-metal, and may be a semi-metal.

In some embodiments, the first non-metal halide reactant is a non-metal halide reactant with the formula Ligand-$SX_2$ or Ligand-SX$_3$, where X is a halide and S can be sulfur or phosphorus, and Ligand can be a dialkylether, such as dimethylether, dialkylthioether, or di-methylthioether; an alkylamine, such as dimethylamine; benzene; an alkyl group; pyridine; thiophene; cyclopropane; or n-haloimino-sulfur. In some embodiments, the first vapor-phase non-metal halide reactant can be trifluoro(N-methylmethanaminato)sulfur. In some embodiments, the first vapor-phase non-metal halide reactant comprises N-fluoroformyliminosulfur difluoride (SF2=NCOF). In some embodiments, the first vapor-phase non-metal halide reactant is a semi-metal halide reactant with the formula SX$_a$, where X is chlorine, bromine, fluorine, or iodine; S is silicon, tellurium, antimony, boron, or germanium; and a is a stoichiometric indicator from 1 to 6, from 1 to 5, from 1 to 4, from 1 to 3, from 1 to 2, or 1.

In some embodiments either or both of the first or second reactant comprises a halide and does not contain hydrogen, or comprises a halide and does not contain either oxygen or hydrogen. In some embodiments either the first or second reactant comprises a halide but does not contain hydrogen, or comprise a halide but not contain either oxygen or hydrogen. In some embodiments at least one of the first and second reactants is not Sn(acac)$_2$. In some embodiments at least one of the first and second reactants is not TMA. In some embodiments at least one of the first and second reactants is not HF gas. In some embodiments at least one of the first and second reactants is not HF-Pyridine. In some embodiments the first and second reactants are not HF and Sn(acac)$_2$. In some embodiments the first and second reactants are not HF and SiCl$_4$. In some embodiments, H is not used. In some embodiments, TMA is not used. In some embodiments Sn(acac)$_2$ is not used.

In some embodiments for controlled etching, one or more ALE cycles are carried out, with each cycle removing material from the desired substrate surface. In some embodiments, up to a monolayer of material is removed in each ALE cycle, where the mass removed per cycle is about a monolayer of volume, assuming density does not change. In some embodiments, more than a monolayer per cycle is removed.

Each ALE cycle typically comprises one or more distinct phases. In some embodiments, an ALE cycle comprises at least two distinct phases. The contacting of the substrate surface and removal of a reactant from the substrate may be considered a phase. Unless indicated otherwise, in each phase the substrate is contacted with a single reactant.

In a first phase, a vapor phase first halide reactant contacts the substrate surface to be etched. In some embodiments, the first reactant forms no more than about one monolayer of adsorbed species. In particular, in some embodiments, the first halide reactant reacts with accessible substrate material, such as atoms and molecules that are to be removed from the substrate surface, to form the adsorbed species.

The first phase is self-limiting in some embodiments. In some instances, it may be the case that the limited availability of particular substrate surface material such as atoms and molecules that are able to react with the vapor phase first reactant species ensures that the reaction is essentially self-limiting. In addition, the formed reaction layer itself can introduce self-limiting behavior. In other embodiments the first reactant is not self-limiting and more than one monolayer of species may form on the substrate surface.

In some embodiments, excess first vapor phase reactant and any reaction byproducts are removed from the proximity of the substrate surface. The first vapor phase reactant and any reaction byproducts may be removed from the proximity of the substrate or substrate surface with the aid of a purge gas and/or vacuum. In some embodiments, excess reactant and/or reactant byproducts are removed from the reaction space by purging, for example, with an inert gas. In some embodiments, the substrate may be moved in order to facilitate removal of the reactant and/or reactant byproducts from the vicinity of the substrate or substrate surface, for example, by moving the substrate to a different reaction chamber.

In a second phase, a second vapor phase halide reactant contacts the substrate and may convert adsorbed species to vapor phase reaction products. The reaction products include atoms of the original material, thus etching the material. In some embodiments, the second reactant comprises the same halide as the first halide reactant. In some embodiments, the second reactant does not comprise a reactive species. Excess second reactant and vapor phase reaction products are removed from the substrate surface, for example, with the aid of vacuum and/or a purge gas. In some embodiments, excess second reactant and reaction byproducts are removed from the reaction space by purging, for example, with an inert gas. In some embodiments purging comprises exposing the substrate surface to a purge gas, such as an inert gas. In some embodiments, the substrate may be moved in order to facilitate the removal of the reactant and/or reaction by-products from the vicinity of the substrate, for example, by moving the substrate to a different reaction chamber.

Additional phases may be added and phases may be removed as desired to adjust the etch rate and/or to influence one or more properties of the etched material, such as its resistivity. In some embodiments, additional phases may be used for the tuning and/or controllability of one or more aspects of the etching process, such as selectivity, uniformity (such as resistance, roughness and thickness), or conformality. In some embodiments, the process comprises more than two phase, more than three phases or more than four phases or more than five phases applied in cyclic manner.

Additional phases may be added and phases may be removed as desired to adjust the etch rate and/or to influence one or more properties of the remaining film after etching film, such as tuning the resistivity, for example the resistivity of the post-etching film may be decreased or increased by factor of 1% or more, 5% or more, 20% or more, 50% or more, or even up to 100% or more; modifying optical properties, for example decreasing or increasing optical parameters like (n,k) of post etching films by factor of 1%, or more than 5%, or more than 20%, or more than 50%, or more than 100%; modifying the film roughness for example by decreasing or increasing the roughness on a post etching film by a factor of 1%, or more than 5%, or more than 20%, or more than 50%, or more than 100%, or improving the selectivity of the etching, for example by decreasing or increasing the selectivity by factor of 1%, or more than 5%, or more than 20%, or more than 50%, or more than 100%.

In some embodiments, the second reactant, such as CCl$_4$, can be used alone, without a first reactant and can provide the desired controlled etching with the desired etch selectivity. In some embodiments, one or more additional reactants may be provided in a separate phase, such as an oxygen reactant like oxygen, water or ozone. In some embodiments, the oxygen reactant comprises one or more of H$_2$O, NO, SO$_3$, O$_2$ and O$_3$.

In some embodiments, the first reactant or the second reactant can be used alone for the etching and can provide the desired controlled etching with the desired etch selectivity. Any formed by-products may be removed by purging and/or by pumping.

In some embodiments, an etch process comprises a single phase in which a first reactant alone is provided in a cyclic pulsing fashion.

In some embodiments, the first and the second reactants can be used interchangeably for the desired controlled etching with the desired etch selectivity.

In some embodiments, a phase is provided that comprises contacting the substrate with a halide reactant. Exemplary halide reactants are provided above.

In some embodiments, a phase is provided in which the substrate is contacted with an oxygen compound. Exemplary oxygen compounds include $H_2O_2$, $H_2O$, $O_2$ or $O_3$. In some embodiments, one or more oxygen compounds are provided with a halide reactant.

In some embodiments, a phase is provided that comprises contacting the substrate with an oxygen scavenger or halide exchange driver, such as $CH_yCl_x$ or $CCl_4$. In some embodiments the halide containing species can be as metal halides. In some embodiments the halide containing species can be as acyl halides including Fumaryl chloride, and malonyl chloride. In some embodiments, no additional reactants are provided.

In some embodiments, a phase is provided that comprises contacting the substrate with a ligand exchanger or metal organic or inorganic reactant. Exemplary reactants include Hacac, and TMA or $Sn(acac)_2$. In some embodiments, the ligand exchanger may comprise a vicinal ketone group, for example hexafluoro acetylacetonato (Hhfac), diacetyl, thd. In Some embodiments a ligand exchanger comprises of a compound having the formula M(thd)x, wherein M is metal, such as a transition metal or alkaline earth metal, and x can be greater than 1 and in some cases greater than 2. In some embodiments the ligand exchanger comprises a metal and at least one 'thd' and/or at least one 'acac' group, or both, for example Mg(thd)(acac).

In some embodiments, various combinations of 1, 2, 3 or all four of these types of phases are provided in an etch cycle. For example, in some embodiments, a substrate comprising a surface to be etched is exposed to a halide reactant in a first phase, an oxygen compound in a second phase, an oxygen scavenger or halide exchange driver in a third phase and a ligand exchanger or metal organic or inorganic reactant in a fourth phase. The phases may be provided in that order, or the order may be changed.

As mentioned above, each phase may be separated from another phase by a step in which excess reactants and reaction by products are removed, such as by a purge step or pump down of the reaction chamber.

One or more of the reactants may be provided with the aid of a carrier gas, such as Ar or He. In some embodiments, the first halide reactant and the second reactant are provided with the aid of a carrier gas. In some embodiments, the carrier gas may flow continuously throughout the process. In some embodiments, the carrier gas may also serve as a purge gas.

The phases together form an ALE etching cycle that controllably removes material from the substrate surface. The ALE etching cycle may be repeated two or more times to etch the material on the substrate surface to a desired degree. In some embodiments, the ALE etching cycle is repeated 10, 20, 50, 100, 200, 400, 600, 800, 1000 or more times to remove the desired amount of material.

In some embodiments, two or more of the phases may overlap, or be combined. For example, a first halide reactant and a second reactant may contact the substrate simultaneously in phases that partially or completely overlap. In addition, although referred to as the first, second, and subsequent phases, and the first and second, and subsequent reactants, the order of the phases may be varied, and an ALE cycle may begin with any one of the phases.

Due to the use of vapor phase reactants, the conformality of the etching process is very good, and material can be removed evenly from all surfaces of a three-dimensional structure. In some embodiments, the conformality of etching vertically is greater than about 90% and the conformality of etching horizontally is greater than about 92%. In some embodiments, conformality of etching in vertical openings is about 50% or greater, about 75% or greater, about 85% or greater, about 90% or greater, about 95% or greater, about 98% or greater, about 99% or greater, and even up to about 100%. In some embodiments, conformality of etching in openings extending horizontally (for example from vertical openings), is about 50% or greater, about 75% or greater, about 85% or greater, about 90% or greater, about 95% or greater, about 98% or greater, about 99% or greater, and even up to about 100%. In some embodiments, conformality for a 3D structure, such as a horizontal or lateral cavity, can be greater than 50%, or greater than 80%, or even greater than 90%, or even higher than 99% and even up to about 100%. Conformality can sometimes be even greater than 100%.

In some embodiments, the substrate comprising a material to be etched, such as a semiconductor workpiece, is loaded into a reaction space or reactor. The reactor may be part of a cluster tool in which a variety of different processes in the formation of an integrated circuit are carried out. In some embodiments, a flow-type reactor is utilized. In some embodiments, a cross-flow reactor is used. In some embodiments, a shower head type of reactor is utilized. In some embodiments, a space divided reactor is utilized. In some embodiments, a high-volume manufacturing-capable single wafer atomic layer deposition reactor is used. In other embodiments, a batch reactor comprising multiple substrates is used.

Examples of suitable reactors that may be used include commercially available equipment such as the F-120® reactor, F-450® reactor, Pulsar® reactors—such as the Pulsar® 2000 and the Pulsar® 3000-EmerALD® reactor and Advance® 400 Series reactors, available from ASM America, Inc. of Phoenix, Ariz. and ASM Europe B.V., Almere, Netherlands. Other commercially available reactors include those from ASM Japan K.K (Tokyo, Japan) under the tradename Eagle® XP and XP8. In some embodiments, the reactor is an etch reactor.

In some embodiments, if necessary, the exposed surfaces of the workpiece can be pretreated to provide reactive sites to react with the first phase of the ALE process. In some embodiments, a separate pretreatment step is not required. In some embodiments the substrate is pretreated to provide a desired surface termination. In some embodiments the substrate is pretreated with plasma.

The reactants, such as a first non-metal halide reactant and second halide reactant (in some embodiments), are supplied to the reaction space in gaseous form. The reactants are considered "volatile" for purposes of the present description if the species exhibits sufficient vapor pressure under the process conditions to transport the species to the workpiece in sufficient concentration to saturate exposed surfaces.

Reactants can be pulsed into the reaction chamber and contacted with the substrate for an appropriate amount of time. In some embodiments, a reactant, such as a non-metal halide reactant, is pulsed into the reaction chamber containing the substrate with the surface to be etched for about 0.01 to about 60 seconds, about 0.05 to about 30 seconds, about 0.05 seconds to about 5.0 seconds, about 0.1 seconds to about 3 seconds or about 0.2 seconds to about 1.0 seconds. In some embodiments, the pulse time may be greater than 60 seconds, for example up to 120 seconds or more. In some embodiments, the halide reactant contacts the substrate surface to be etched for about 0.01 to about 60 seconds, about 0.05 to about 30 seconds, about 0.05 seconds to about 5.0 seconds, about 0.1 seconds to about 3 seconds or about 0.2 seconds to about 1.0 seconds. In some embodiments, the pulse time may be greater than 60 seconds, for example up to 120 seconds. The optimum time can be determined by the skilled artisan based on the particular circumstances.

In some embodiments, excess reactant and/or reaction by-products are removed for about 0.01 to about 60 seconds, 0.05 to about 30 seconds, about 0.1 seconds to about 10 seconds, about 0.3 seconds to about 5 seconds or about 0.3 seconds to about 1 second. In some embodiments, it may be 60 seconds or more.

In some embodiments, in which an etch cycle comprises a first halide reactant phase and a second halide phase, the first halide reactant (such as a metal or non-metal halide) is pulsed into the reaction chamber containing the substrate with the surface to be etched for about 0.01 to about 60 seconds, about 0.05 to about 30 seconds, about 0.05 seconds to about 5.0 seconds, about 0.1 seconds to about 3 seconds or about 0.2 seconds to about 1.0 seconds. In some embodiments, the pulse time may be greater than 60 seconds, for example, up to 120 seconds or more. In some embodiments, the first halide reactant contacts the substrate surface to be etched for about 0.01 to about 60 seconds, about 0.05 to about 30 seconds, about 0.05 seconds to about 5.0 seconds, about 0.1 seconds to about 3 seconds or about 0.2 seconds to about 1.0 seconds. In some embodiments, the pulse time may be greater than 60 seconds, for example up to 120 seconds. The optimum time can be readily determined by the skilled artisan based on the particular circumstances.

As mentioned above, after sufficient time for about a molecular layer to react with the material to be removed on the substrate surface and form the adsorbed species, excess first halide reactant, and reaction byproducts, if any, are removed from the substrate surface. In some embodiments, removing excess halide reactant and reaction byproducts, if any, may comprise purging the reaction chamber. In some embodiments, the reaction chamber may be purged by stopping the flow of the first halide reactant while continuing to flow a carrier gas or purge gas for a sufficient time to diffuse or purge excess reactants and reactant by-products, if any, from the reaction space. Reaction by-products may comprise, for example, oxyhalides. In some embodiments, the excess first halide reactant is purged with the aid of inert gas, such as nitrogen, helium or argon, which is flowing throughout the ALE cycle. In some embodiments, the substrate may be moved from the reaction space containing the first halide reactant to a second, different reaction space. In some embodiments, the first halide reactant is removed for about 0.01 to about 60 seconds, 0.05 to about 30 seconds, about 0.1 seconds to about 10 seconds, about 0.3 seconds to about 5 seconds or about 0.3 seconds to about 1 second. In some embodiments, it may be 60 seconds or more.

In the second phase, the second halide reactant, such as CCl$_4$, is provided to the workpiece. Typically the second halide reactant is pulsed into the reaction chamber containing the substrate with the surface to be etched for about 0.01 to about 60 seconds, about 0.05 to about 30 seconds, about 0.05 seconds to about 5.0 seconds, about 0.1 seconds to about 3 seconds or about 0.2 seconds to about 1.0 seconds. In some embodiments, the second halide reactant contacts the substrate surface to be etched for about 0.05 seconds to about 5.0 seconds, about 0.1 seconds to about 3 seconds or about 0.2 seconds to about 1.0 seconds. In some embodiments, the pulse may be greater than about 60 seconds. However, depending on the reactor type, material being etched and other process conditions, such as surface area and temperature, the second reactant contacting time may be even higher than about 10 seconds. In some embodiments, contacting times can be on the order of minutes. The optimum contacting time can be readily determined by the skilled artisan based on the particular circumstances.

The second halide reactant reacts with the adsorbed species to form vapor phase reaction by-products that include atoms of the material being etched. Excess second halide reactant and the vapor phase reaction by-products are removed from the reaction chamber. In some embodiments, removing excess reactant and reaction byproducts may comprise purging the reaction chamber. In some embodiments, the reaction chamber may be purged by stopping the flow of the second reactant while continuing to flow a carrier gas or purge gas for a sufficient time to diffuse or purge excess reactants and reactant by-products, from the reaction space. In some embodiments, the excess second reactant and reaction by-products are purged with the aid of inert gas, such as helium or argon. In some embodiments, the substrate may be moved from the reaction space containing the second reactant to a different reaction space. The pulse of purge gas may, in some embodiments, be from about 0.1 seconds to about 10 seconds, about 0.1 seconds to about 4 seconds or about 0.1 seconds to about 0.5 seconds.

According to some embodiments, ALE cycles may be performed at temperatures ranging from about 20 to about 1200° C., about 50 to about 800° C., about 75 to about 600° C., about 300° C. to about 500° C., or from about 350° C. to about 450° C. In some embodiments, the temperature is greater than about 20, 50 or 100° C., but less than about 1000, 800, 600 or 500° C. In some embodiments, the cycles are carried out at a temperature of about 450° C.

The pressure in the reaction chamber is typically from about 10E-9 torr to about 760 torr, or about 0.001 to about 100 torr. However, in some cases, the pressure will be higher or lower than this range, as can be determined by the skilled artisan given the particular circumstances. In some embodiments, a pressure of less than 2 torr is utilized. In some cases the reactor can be operated either in isothermal (such as hot-wall) or non-isothermal (such as cold-wall) conditions. In some embodiments the reactor itself does not interact with etching chemistries and may also not interact with substrates. In some cases reactor can comprise a hot-wall, cold-wall or warm-wall type of reaction chamber.

The substrate comprising a material to be etched, also referred to as target material, can take a variety of forms. In some embodiments, the substrate may be an integrated circuit workpiece or other substrate. The target material to be etched may comprise a thin film on the substrate surface. In some embodiments, the target material is a thin film on a three-dimensional structure on a substrate. The substrate comprising a thin film or other material to be etched may comprise various types of other materials. For example, in some embodiments the substrate may comprise silicon in addition to a material that is targeted by the etching process. In some embodiments, the etch process is selective relative to other materials on the substrate or in the reaction chamber.

In some embodiments, the target material to be etched comprises a metal, such as Ti, Ta, Al, Zr or Hf, W. In some embodiments, the material to be etched comprises one or more of W, TiN, TiO$_2$, TaN, SiN, SiO$_x$, AlO$_x$, AlO$_2$, Al$_2$O$_3$, ZrOx, ZrO$_2$, WO$_3$, AlN, HfO$_x$ and HfO$_2$. In some embodiments, the material to be etched comprises metal nitride or metal oxide or mixtures thereof. In some embodiments the material to be etched may comprise Si, Ge, a-C, graphene, polymers, SiO$_x$, metals, including Pt, Fe, Cu, Au, and Zn in addition to the metals provided above.

In some embodiments, the etch target material comprises a metal, such as W, Pt, Cu, Ni, Co, Ti, Zn, Nb, Mo, or Ta. In some embodiments, the etch target material comprises a metal nitride, for example MoN, NbN, SiN, TiN, TaN, WN, or AN. In some embodiments, the etch target material comprises a carbide, such as SiC, TiC, TaC, AlC, HfC, MoC, or NbC. In some embodiments, the etch target material comprises an oxide, such as s dielectric oxide, for example AlO$_x$, ZrO$_x$, HfO$_x$, TiO$_x$, TaO$_x$, NbO$_x$, MoO$_x$, SiO$_x$, or LaO$_x$. In some embodiments, the etch target material comprises a 2D materials and/or sulfide, such as WS$_2$, MoS$_2$, TiS$_2$, SnS$_2$. In some embodiments, the etch target material comprises a metal oxynitride, such as TiON$_x$, a metal carbonitride, such as WNC, an oxycarbide, or an elemental substrate like Si, C, a-C, or graphene.

In some embodiments, a thin film comprising one or more of W, TiN, TiO$_2$, TaN, SiN, SiO$_x$, AlO$_x$, AlO$_2$, Al$_2$O$_3$, ZrO$_x$, ZrO$_2$, WO$_3$, AlN, HfO$_x$ and HfO$_2$ is etched by an ALE process comprising alternately and sequentially contacting a substrate comprising the thin film with NbF$_5$ and CCl$_4$. In some embodiments, a thin film comprising one or more of W, TiN, TiO$_2$, TaN, SiN, SiO$_x$, AlO$_x$, AlO$_2$, Al$_2$O$_3$, ZrO$_x$, ZrO$_2$, WO$_3$, AlN, HfO$_x$ and HfO$_2$ is etched by an ALE process comprising alternately and sequentially contacting a substrate comprising the thin film with a first halide reactant, such as a non-metal or metal halide as described herein, and a second halide reactant, wherein the first halide reactant and the second halide reactant comprise the same halide.

In some embodiments, the ALE process has an average etch rate of about 0.01 to about 5 Å/cycle. Etch rate is defined as amount of material or thickness of film is removed after each cycle. For practical reasons etch rate can be calculated after 1 etching cycle, after more than 2 etching cycles or more than 5 or even higher than 20 or sometimes higher than 50 cycles. In some embodiments, the average etch rate is about 0.01 to 0.1 Å/cycle or from 0.1 to about 2 Å/cycle or in some cases even higher than 2 Å/cycle. In some embodiments, the average etch rate is more than about 0.1 Å/cycle, more than about 0.5 Å/cycle, more than about 1.0 Å/cycle, more than about 2.0 Å/cycle, more than about 3.0 Å/cycle, more than about 5.0 Å/cycle, more than about 10 Å/cycle or more than about 20 Å/cycle and in some instances if continuous flow is applied with flow rate modification or the exposure times are long enough the etch rates can be more than about 30 Å/cycle, more than about 50 Å/cycle or more than about 100 Å/cycle.

In some embodiments the etch selectivity i.e. the ratio of material (thickness, mass or amount of atoms/molecules) removed from the desired surface/material to material removed from the non-desired surface/materials or surfaces/materials, is from more than about 2:1, more than about 3:1, more than about 5:1, more than about 7:1, more than about 10:1, more than about 15:1, more than about 20:1, more than about 30:1, more than about 50:1, more than about 100:1, more than about 1000:1. In some embodiments no substantial amount of material is removed from the non-desired surface/material.

In some embodiments the flow of the first or second reactant can be equal to or higher than 2 sccm, can be equal to or greater than 10 sccm or sometimes even higher than 50 sccm or can be more than 100 sccm or more than 500 sccm. In some embodiments first reactant can be continuously flown into the reaction chamber while second reactant is flown intermittently.

FIG. 1 is a flow chart that depicts an embodiment of an ALE method generally. The ALE method depicted in FIG. 1 comprises a first exposing step 100, a first removing step 110, a second exposing step 120, and a second removing step 130.

In some embodiments, a substrate having an etch target material is placed in a reaction chamber and exposed to a first vapor-phase halide reactant in the first exposing step 100. The etching target is typically exposed to the first vapor-phase reactant for a period of time as provided above. In some embodiments, the pulse time is about 0.1 to 10 seconds, or 0.1 to 5 seconds.

After the first exposing step 100, excess first vapor-phase halide reactant is removed from the reaction chamber in the first removing step 110. The reaction chamber may be evacuated with a vacuum pump and or/by replacing the gas inside the reactor with an inert gas such as argon or nitrogen. The removing step 110 may typically take about 0.05 to 20 seconds. However, the removing step may take more or less time if necessary.

The substrate is subsequently be exposed to a second vapor-phase halide reactant in the second exposing step 120. The second halide reactant may comprise the same halide ligand as the first vapor-phase metal halide reactant. The etching target is typically exposed to the second vapor-phase reactant for a period of time as discussed above, for example, about 0.1 seconds to 10 seconds.

After the second exposing step 120, excess second vapor-phase halide reactant and volatile reaction byproducts are removed from the reaction chamber in the second removing step 130. In some embodiments, the first exposing step 100, the first removing process 110, the second exposing step 120, and the second removing step 130 form an ALE etch cycle 150 that may be repeated until a desired amount of etching of the target material is obtained. In some embodiments, the first exposing step 100, the first removing process 110, the second exposing step 120, and the second removing step 130 may be repeated for 10, 20, 50, 100, 200, 500, 1000 or more cycles.

In some embodiments the first halide reactant is a semimetal and non-metal halide reactant comprising one or more than halide and one or more than elements like S, P, Se, Sb, Te, N.

In some embodiments, the first halide reactant is a metal halide reactant comprising Nb, Ta, Mo or W.

Figure 2:
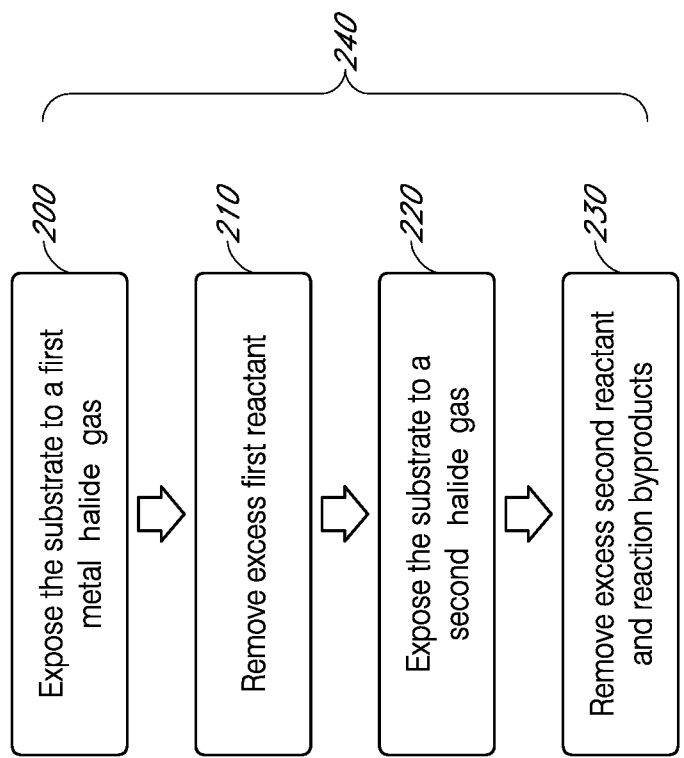
FIG. 2 is a flow chart generally illustrating a method for thermal atomic layer etching using halide reactants in accordance with some embodiments.

Referring to FIG. 2, according to some embodiments an etch target thin film, such as a thin film comprising W, TiN, TiO$_2$, TaN, SiN, SiO$_x$, AlO$_2$, Al$_2$O$_3$, ZrO$_2$, WO$_3$, AlN or HfO$_2$ on a substrate in a reaction space is etched by an ALE process comprising at least one etch cycle 240 comprising: contacting the substrate with a vapor phase metal halide reactant that does not comprise excited species at step 200 such that the metal halide reactant reacts with the thin film on the surface of the substrate to form adsorbed species; removing excess metal halide reactant and reaction byproducts, if any, from the substrate surface at step 210; contacting the substrate with a second halide reactant that does not comprise reactive species at step 220 thereby converting the adsorbed silicon species into vapor phase reaction by-products that include atoms of the etch target thin film;

removing excess second halide reactant and reaction byproducts, if any, from the substrate surface at step 230; and optionally repeating the contacting and removing steps at step 240 to etch the etch target thin film to a desired extent.

Figure 3:
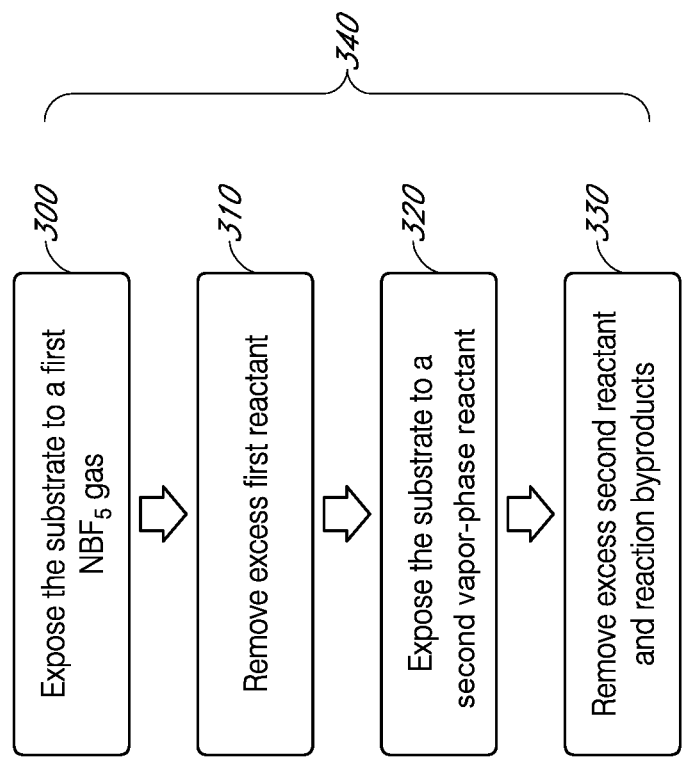
FIG. 3 is a flow chart generally illustrating a method for thermal atomic layer etching using $NbF_5$, $SO_2Cl_2$, $SeO_2Cl_2$, $SeOCl_2$, or $CCl_4$ as reactants in accordance with some embodiments.

Referring to FIG. 3, according to some embodiments an etch target thin film, such as a thin film comprising W W, TiN, $TiO_2$, TaN, SiN, $SiO_x$, $AlO_x$, $AlO_2$, $Al_2O_3$, $ZrO_x$, $ZrO_2$, $WO_3$, AlN, $HfO_x$ or $HfO_2$ on a substrate in a reaction space is etched by an ALE process comprising at least one etch cycle 340 comprising: contacting the substrate with vapor phase $NbF_5$ at step 300; removing excess $NbF_5$ and reaction byproducts, if any, from the substrate surface at step 310; contacting the substrate with vapor phase $CCl_4$ at step 320; removing excess $SO_2Cl_2$, $SeOCl_2$, or $CCl_4$ and reaction byproducts from the substrate surface at step 330; and optionally repeating the contacting and removing steps at step 340 to etch the etch target thin film to a desired extent.

Figure 4:
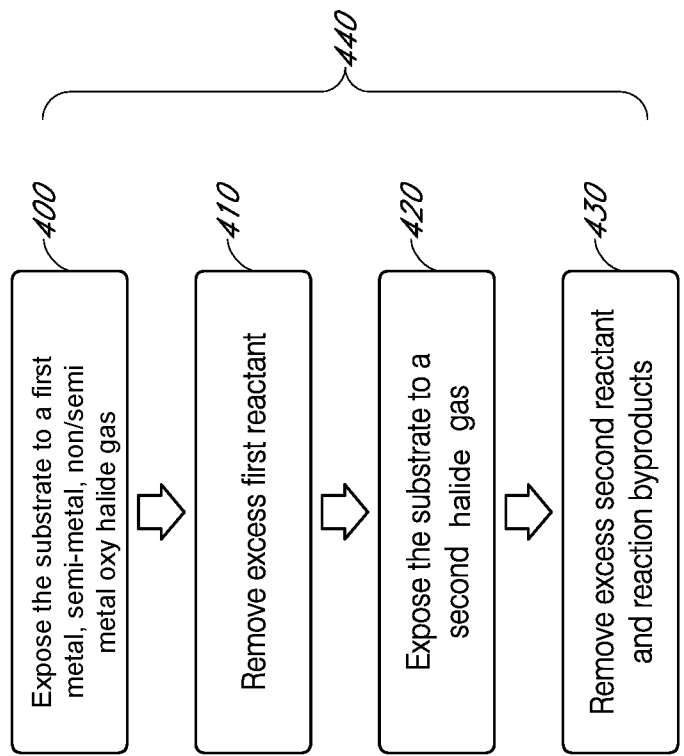
FIG. 4 is a flow chart generally illustrating a method for thermal atomic layer etching using vapor phase halide reactants in accordance with some embodiments.

Referring to FIG. 4, according to some embodiments an etch target thin film, such as a thin film comprising W, TiN, $TiO_2$, TaN, SiN, SiOX, $AlO_2$, $Al_2O_3$, $ZrO_2$, $WO_3$, AlN or $HfO_2$, on a substrate in a reaction space is etched by an ALE process comprising at least one etch cycle 440 comprising: contacting the substrate with a vapor phase metal, semi-metal, non/semi metal oxy halide reactant that does not comprise excited species at step 400 such that the non-metal chloride reactant reacts with the thin film on the surface of the substrate to form adsorbed species; removing excess metal, semi-metal, non/semi metal oxy halide reactant and reaction byproducts, if any, from the substrate surface at step 410; contacting the substrate with a second halide reactant that does not comprise reactive species at step 420 thereby converting the adsorbed silicon species into vapor phase reaction by-products that include atoms of the etch target thin film; removing excess second halide reactant and reaction byproducts, if any, from the substrate surface at step 430; and optionally repeating the contacting and removing steps at step 440 to etch the etch target thin film to a desired extent.

Figure 5:
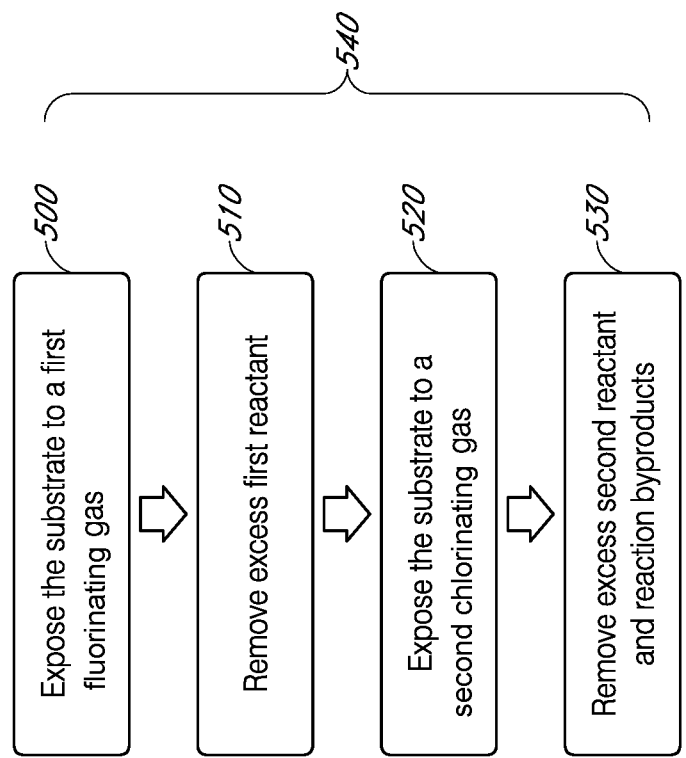
FIG. 5 is a flow chart generally illustrating a method for thermal atomic layer etching using a fluorinating agent and chlorinating agent as reactants in accordance with some embodiments.

Referring to FIG. 5, according to some embodiments an etch target thin film, such as a thin film comprising W W, TiN, $TiO_2$, TaN, SiN, $SiO_x$, $AlO_x$, $AlO_2$, $Al_2O_3$, $ZrO_x$, $ZrO_2$, $WO_3$, AlN, $HfO_x$ or $HfO_2$ on a substrate in a reaction space is etched by an ALE process comprising at least one etch cycle 540 comprising: contacting the substrate with a vapor phase fluorinating gas, such as $NbF_6$ or $TeF_6$ at step 500; removing excess of reactants and reaction byproducts, if any, from the substrate surface at step 510; contacting the substrate with vapor phase chlorinating gas, such as $SeO_2Cl_2$, $SeO_2F_2$, $S_2Cl_2$, $SO_2F_2$, $SO_2Cl_2$ or, $CCl_4$ at step 520; removing excess chlorinating gas and reaction byproducts from the substrate surface at step 530; \and optionally repeating the contacting and removing steps at step 540 to etch the etch target thin film to a desired extent. In some embodiments the chlorinating gas may be provided in the first step 500 and the fluorinating gas may be provided in the second reactant exposure 520.

Examples

Thermal ALE was used to etch thin films of $SiO_2$ (thermal and native), TiN, $TiO_x$, TaN, $AlO_x$, AlN, $ZrO_x$ and $HfO_x$. The ALE cycle comprised alternate and sequentially contacting a substrate comprising the relevant film with $NbF_5$ and $CCl_4$; $NbF_5$ and a combination of $CCl_4$ and $H_2O$; $NbF_5$ and a combination of $CCl_4$ and $O_3$; or $CCl_4$ alone. As shown in Table 1 below, etching of each of the types of thin films was observed, with the etch rate ranging from about 0.1 Å/cycle to about 1.8 Å/cycle. No etching of $SiO_2$ films or native oxide was observed.

TABLE 1

| | | | Etch rate (Å/cycle) | | | | | | |
|---|---|---|---|---|---|---|---|---|---|
| Reactant 1 | Reactant 2 | $T_{reac.}$ ° C. | TiN | TiOx | TaN | AlOx | AlN | ZrOx | HfOx |
| NbF5 | CCl4 | 458 | ~0.2 | 1.8 | Yes (0.5) | 0.1-1.6 | | 0.4 | 0.1-1.8 |
| NbF5 | CCl4 + H2O | 458 | Yes | Yes | Bulk rem. | Yes | Yes | Yes | Yes |
| NbF5 | CCl4 + O3 | 458 | Yes | Yes | Bulk rem. | Yes | Yes | Yes | Yes |
| | CCl4 | 458 | 0.1 | — | 0.4 | No | — | No | No |

— Not tested

Figure 6:
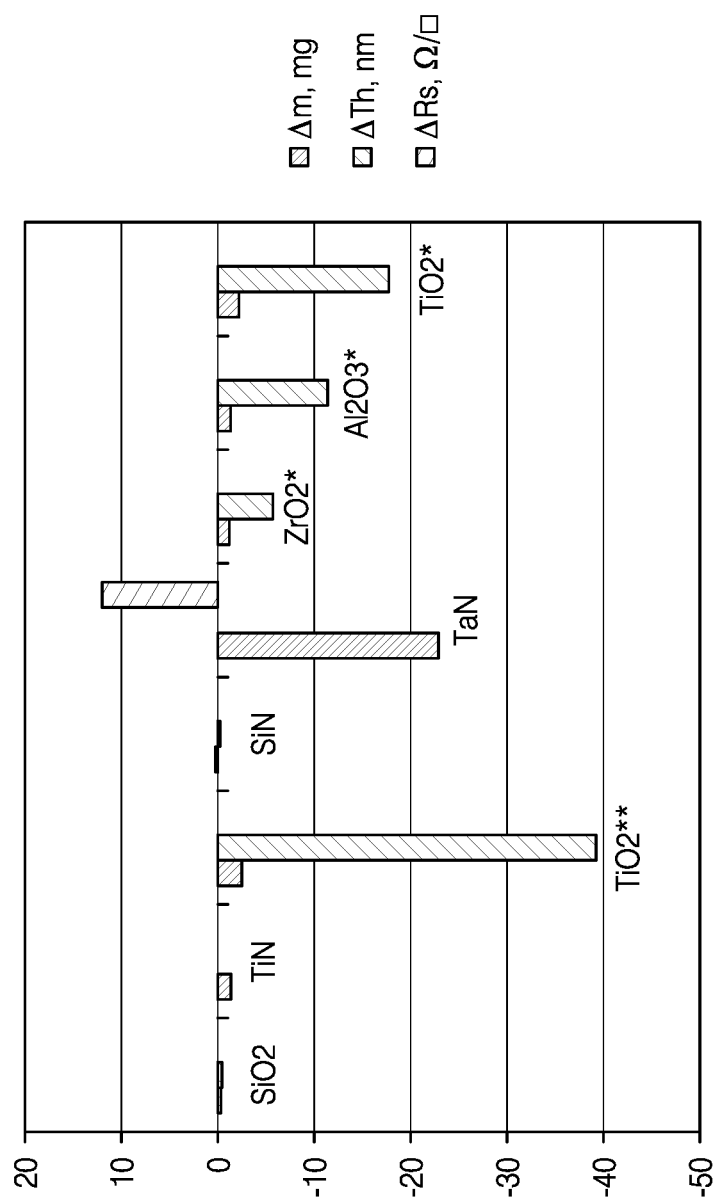
FIG. 6 is a graph showing the differences in mass, thickness, and sheet resistance of $SiO_2$, TiN, AlN, $TiO_2$, SiN, TaN, $ZrO_2$, and $Al_2O_3$ films after ALE processing using $NbF_5$ and $CCl_4$ as reactants.

FIG. 6 is a graph showing the differences of mass, thickness, and sheet resistance of $SiO_2$, TiN, $TiO_2$, SiN, TaN, $ZrO_2$, and $Al_2O_3$ after thermal ALE processing. Substrates comprising thin films of each material were placed in a Pulsar 2000™ reactant. The thermal ALE cycle comprised alternate and sequential pulses of $NbF_5$ and $CCl_4$. The substrate temperature was about 450° C. (susceptor temperature of 465° C. and top plate temperature of 405° C.). Mass, thickness and sheet resistance were measured after 1000 ALE cycles for the $SiO_2$, Tin, $TiO_2$, SiN, and TaN films and after 100 cycles for $ZrO_2$, $Al_2O_3$ and $TiO_2$ films. Noticeable changes were observed for TiN, $TiO_2$, TaN, $ZrO_2$, and $Al_2O_3$ from the graph. With regards to $TiO_2$, after 1000 etch cycles the thickness of the film decreased about 40 nm, consuming the entire layer. After 100 cycles the thickness decreased about 20 nm. With regards to TaN, the mass decreased about 22 mg and the sheet resistant increased about 11Ω/☐ after 1000 cycles. With regards to $ZrO_2$, the thickness decreased about 5 nm after 100 cycles. With regards to $Al_2O_3$, the thickness decreased about 11 nm after 100 cycles.

Figure 7:
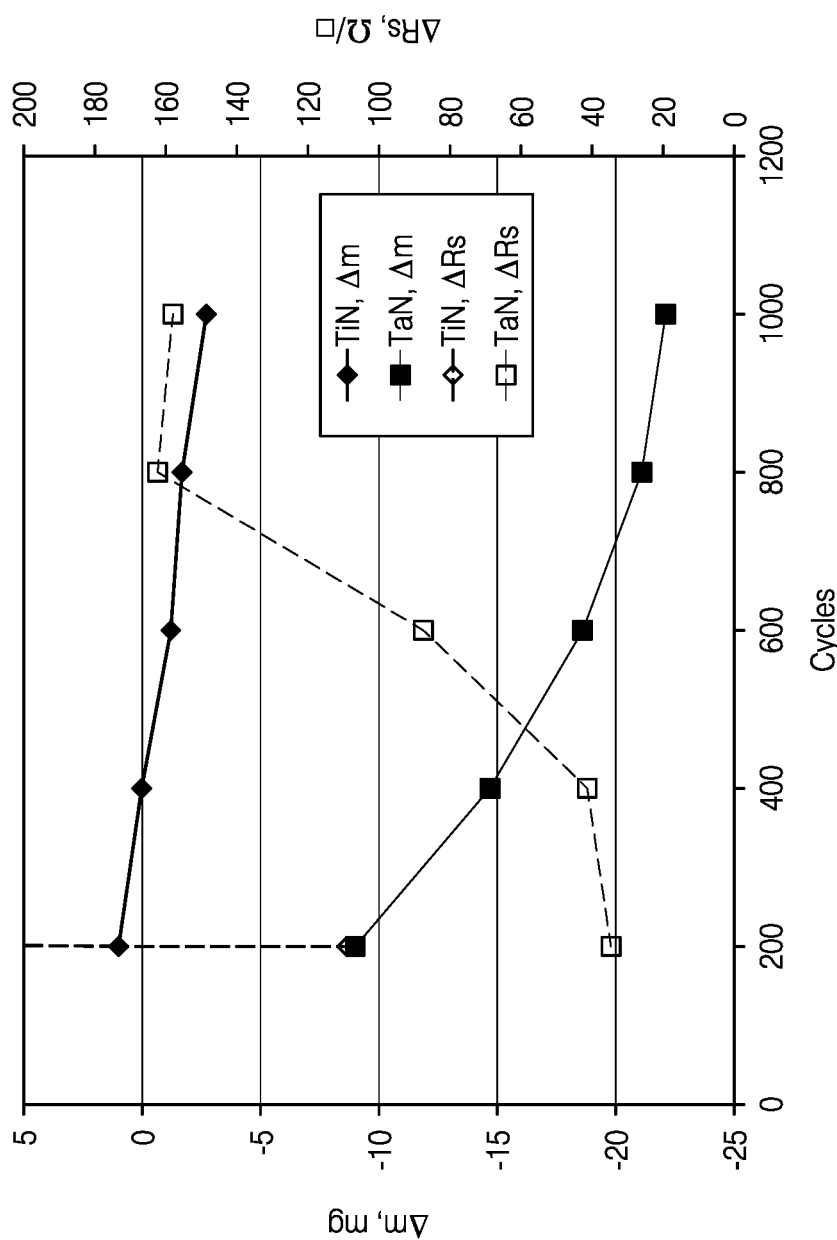
FIG. 7 is a graph showing the weight and sheet resistance of substrates comprising TiN and TaN films after varying numbers of ALE cycles using $NbF_5$ and $CCl_4$ as reactants.

FIG. 7 is a graph of the weight and sheet resistance changes of TiN and TaN films after varying numbers of ALE cycles with $NbF_5$ and $CCl_4$ at a reaction temperature of about 450° C. Visual inspection revealed complete removal of 20 nm TiN films at the center of the wafer after 400 cycles.

It will be appreciated by those skilled in the art that various modifications and changes can be made without departing from the scope of the invention. Similar other modifications and changes are intended to fall within the scope of the invention, as defined by the appended claims.

What is claimed is:

1. A method of etching a film on a substrate in a reaction chamber by chemical atomic layer etching, the method comprising one or more etching cycles comprising:
    exposing the substrate to a first vapor-phase oxyhalide reactant; and
    purging or evacuating the reaction chamber to remove excess first vapor-phase oxyhalide halide reactant, wherein the first vapor-phase oxyhalide reactant does not comprise metal, wherein the substrate is not contacted with a plasma reactant during the etching cycle, and wherein each etching cycle removes material from the film.

2. The method of claim 1, further comprising exposing the substrate to a vapor-phase metal or semi-metal halide reactant.

3. The method of claim 2, wherein the vapor-phase metal or semi-metal halide reactant comprises Te, Sb, As, Nb, Ta, Mo, Sn, V, Re, Te, W or a group 6 transition metal.

4. The method of claim 2, wherein the vapor phase metal or semi-metal halide reactant comprises sulfur atoms.

5. The method of claim 2, wherein the vapor phase metal or semi-metal halide reactant comprises oxygen atoms.

6. The method of claim 1 wherein the first vapor phase oxyhalide reactant comprises carbon, oxygen and halide atoms.

7. The method of claim 1, further comprising exposing the substrate to a second vapor-phase oxyhalide reactant.

8. The method of claim 7, wherein the etch cycle additionally comprises exposing the substrate to a third vapor-phase reactant that is different from the first and second vapor-phase oxyhalide reactants.

9. The method of claim 8, where the third vapor-phase reactant comprises oxygen.

10. The method of claim 8, wherein the third vapor-phase reactant comprises $H_2O_2$, HCOOH, $H_2O$, $O_2$ or $O_3$.

11. The method of claim 8, where the third vapor-phase reactant comprises a ligand exchanger.

12. The method of claim 8, wherein the third vapor-phase reactant comprises trimethylaluminum (TMA), Hacac, Sn(acac)2, or Hhfac.

13. The method of claim 8, where the third vapor phase reactant comprises an adduct forming compound.

14. The method of claim 8, wherein the third vapor phase reactant comprises $CS_2$, $CH_3CN$, $NH_3$, $SO_3$, tris(2-aminoethyl)amine, triethanolamine, pyridine, tetrahydrofuran (THF), dimethylsulfoxide (DMSO), tetrahydrothiophene, 1,4-dioxane, an isocyanate, a poly-ol, ethanolamine, a sulfone, trichloromethane, an alkyl or substituted isothiocyanate, trichloronitromethane, an alkyl, aryl or substituted nitrile, an isonitrile, a diamine, a dithione, a sulfone, TIPA, TIPEA, TMEA or a heterocylic reactive compound.

15. The method of claim 1, wherein the first vapor-phase oxyhalide reactant comprises a semi-metal.

16. The method of claim 1, wherein the first vapor-phase oxyhalide reactant does not comprise carbon.

17. The method of claim 1, wherein the first vapor-phase oxyhalide reactant does not comprise a hydrocarbon group.

18. The method of claim 1, wherein the first vapor-phase oxyhalide reactant does not comprise hydrogen.

19. The method of claim 1, wherein the first vapor-phase oxyhalide reactant does not comprise hydrogen or carbon.

20. The method of claim 1, wherein the first vapor-phase oxyhalide reactant comprises sulfur, halide and oxygen atoms.

21. The method of claim 1, wherein the first vapor-phase oxyhalide reactant comprises halide and nitrogen atoms.

22. The method of claim 1, wherein the first vapor-phase oxyhalide reactant comprises sulfur, halide and nitrogen atoms.

23. The method of claim 1, wherein the first vapor-phase oxyhalide reactant comprises sulfur, halide, oxygen and nitrogen atoms.

24. The method of claim 1, wherein the first vapor-phase oxyhalide reactant comprises of sulfur, halide, carbon and nitrogen atoms.

25. The method of claim 1, wherein the first vapor-phase oxyhalide reactant comprises of sulfur, halide, carbon, oxygen and nitrogen atoms.

26. The method of claim 1, wherein the substrate comprises two or more different materials that are exposed to the first vapor-phase oxyhalide reactant and one material is selectively etched relative to the other materials.

27. The method of claim 1, wherein the film comprises a metal oxide, metal carbide, metal nitride or is an elemental film.

28. The method of claim 27, wherein the film comprises Ti, Mo, Cu, Co, W, Si, Ta, Al, Zr, Hf, Ge, Pt, Ni, Zn, Nb 1r, Ru, Rh, or Sb.

29. The method of claim 1, wherein the temperature of the substrate during the etching cycle is 150° C. to 600° C.

30. The method of claim 1, wherein the substrate is a semiconductor wafer.

31. The method of claim 1, wherein the method has an average etch rate of 0.01 to 5 A/cycle.

* * * * *

UNITED STATES PATENT AND TRADEMARK OFFICE
CERTIFICATE OF CORRECTION

PATENT NO. : 11,183,367 B2
APPLICATION NO. : 16/881868
DATED : November 23, 2021
INVENTOR(S) : Tom E. Blomberg et al.

It is certified that error appears in the above-identified patent and that said Letters Patent is hereby corrected as shown below:

On the Title Page

On Page 2, Column 2, Line 18, under item (56) Other Publications, Delete "Selflimiting" and insert --Self-limiting--.

On Page 2, Column 2, Line 39, under item (56) Other Publications, Delete "Nb2O5" and insert --$Nb_2O_5$--.

On Page 2, Column 2, Line 44, under item (56) Other Publications, Delete "Sulferic" and insert --Sulfuric--.

On Page 3, Column 1, Line 6, under item (56) Other Publications, Delete "Chern" and insert --Chem--.

On Page 3, Column 1, Line 8, under item (56) Other Publications, Delete "Slution" and insert --Solution--.

On Page 3, Column 1, Line 30, under item (56) Other Publications, Delete "Ta2O5" and insert --$Ta_2O_5$--.

On Page 3, Column 1, Line 30, under item (56) Other Publications, Delete "Ti02" and insert --$TiO_2$--.

In the Drawings

On Sheet 4 of 7, Line 3, Reference Number 400, FIG. 4, and on the title page, the print figure, Delete "oxy halide" and insert --oxyhalide--.

Signed and Sealed this
First Day of March, 2022

Drew Hirshfeld
*Performing the Functions and Duties of the
Under Secretary of Commerce for Intellectual Property and
Director of the United States Patent and Trademark Office*

CERTIFICATE OF CORRECTION (continued)

U.S. Pat. No. 11,183,367 B2

In the Specification

In Column 4, Line 48, Delete "CXaY4-a, and CnXaY(2n+2-a)" and insert --$CX_a Y_{4-a}$, and $C_nX_a Y_{(2n+2-a)}$--.

In Column 5, Line 12, Delete "NXa," and insert --$NX_a$,--.

In Column 5, Line 66, Delete "cyclohexanedienes" and insert --cyclohexanediones--.

In Column 7, Line 2, Delete "by products" and insert --byproducts--.

In Column 8, Line 7, Delete "ClF3" and insert --$ClF_3$--.

In Column 8, Line 7, Delete "ClF5" and insert --$ClF_5$--.

In Column 9, Line 14, Delete "oganic" and insert --organic--.

In Column 12, Line 58, Delete "CCl4" and insert --$CCl_4$--.

In Column 12, Line 40, Delete "SXa" and insert --$SX_a$--.

In Column 12, Line 44, Delete "SiC14, SbF5, SbC13, SbC15 or BC13" and insert --$SiCl_4$, $SbF_5$, $SbCl_3$, $SbCl_5$ or $BCl_3$--.

In Column 12, Line 47, Delete "SeO2Cl2, SO2Cl2, SeOCl2" and insert --$SeO_2Cl_2$, $SO_2Cl_2$, $SeOCl_2$--.

In Column 12, Line 49, Delete "NC12F, NF2Cl, NOF, NO2F" and insert --$NCl_2F$, $NF_2Cl$, $NOF$, $NO_2F$--.

In Column 12, Line 53, Delete "CCl4" and insert --$CCl_4$--.

In Column 12, Line 56, Delete "C3Cl6O3" and insert --$C_3Cl_6O_3$--.

In Column 12, Line 58, Delete "CCl4" and insert --$CCl_4$--.

In Column 12, Line 58, Delete "CBr4" and insert --$CBr_4$--.

In Column 12, Line 59, Delete "GeCl4" and insert --$GeCl_4$--.

In Column 12, Line 61, Delete "CC14 or CBr4" and insert --$CCl_4$ or $CBr_4$--.

In Column 12, Line 63, Delete "CXaY4-a, and CnXa Y(2n+2-a)" and insert --$CX_aY_{4-a}$, and $C_nX_aY_{(2n+2-a)}$--.

In Column 15, Line 50, Delete "by products" and insert --byproducts--.

CERTIFICATE OF CORRECTION (continued)
U.S. Pat. No. 11,183,367 B2

In Column 19, Line 5, Delete "ZrOx," and insert --ZrO$_x$,--.

In Column 19, Line 15, Delete "AN." and insert --AlN.--.

In Column 21, Line 6, Delete "W W," and insert --W,--.

In Column 21, Line 35, Delete "SiOX," and insert --SiO$_x$,--.

In Column 21, Line 39, Delete "oxy halide" and insert --oxyhalide--.

In Column 21, Line 43, Delete "oxy halide" and insert --oxyhalide--.

In Column 21, Line 55, Delete "W W," and insert --W,--.

In Column 21, Line 66, Delete "530; \and" and insert --530; and--.

In Columns 21-22, Line 2 (Table 1), Delete "ZrOx" and insert --ZrO$_x$--.

In Columns 21-22, Line 2 (Table 1), Delete "HfOx" and insert --HfO$_x$--.

In Columns 21-22, Line 3 (Table 1), Delete "CC14" and insert --CCl$_4$--.

In Columns 21-22, Line 3 (Table 1), Delete "NbF5" and insert --NbF$_5$--.

In the Claims

In Column 23, Claim 12, Line 41, delete "Sn(acac)2," and insert --Sn(acac)$_2$,--.

In Column 24, Claim 14, Line 4, delete "heterocylic" and insert --heterocyclic--.

In Column 24, Claim 28, Line 40, delete "1r," and insert --Ir,--.

In Column 24, Claim 31, Line 47, delete "A/cycle" and insert --Å/cycle--.